(12) United States Patent
Michejda et al.

(10) Patent No.: US 6,864,547 B2
(45) Date of Patent: Mar. 8, 2005

(54) SEMICONDUCTOR DEVICE HAVING A GHOST SOURCE/DRAIN REGION AND A METHOD OF MANUFACTURE THEREFOR

(75) Inventors: John A. Michejda, Berkeley Heights, NJ (US); Ian Wylie, Greenwich, NJ (US)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 09/882,911

(22) Filed: Jun. 15, 2001

(65) Prior Publication Data

US 2002/0190344 A1 Dec. 19, 2002

(51) Int. Cl.$^7$ .................. H01L 29/76; H01L 29/94; H01L 31/062; H01L 31/113; H01L 31/119
(52) U.S. Cl. .................. 257/386; 257/372; 257/294; 257/395; 257/396; 257/397
(58) Field of Search .................. 257/372–374, 257/394–396, 386, 389, 397, 349, 383, 382.3, 501, 503, 505, 345, 400, 401, 336, 344, 48

(56) References Cited

U.S. PATENT DOCUMENTS

| 4,551,743 A | 11/1985 | Murakami | |
|---|---|---|---|
| 4,769,687 A | 9/1988 | Nakazato et al. | |
| 4,862,232 A | * 8/1989 | Lee | 257/382 |
| 4,992,843 A | 2/1991 | Blossfeld et al. | |
| 5,086,322 A | * 2/1992 | Ishii et al. | 357/23.3 |
| 5,258,642 A | 11/1993 | Nakamura | |
| 5,391,907 A | 2/1995 | Jang | |
| 5,494,837 A | * 2/1996 | Subramanian et al. | 438/149 |
| 5,598,019 A | * 1/1997 | Komori et al. | 257/397 |
| 5,705,440 A | * 1/1998 | Roh et al. | 438/294 |
| 5,753,557 A | * 5/1998 | Tseng | 438/303 |
| 5,814,863 A | * 9/1998 | Pan | 257/346 |
| 5,834,793 A | * 11/1998 | Shibata | 257/25 |
| 5,877,046 A | 3/1999 | Yu et al. | |
| 6,013,936 A | 1/2000 | Colt, Jr. | |
| 6,246,094 B1 | 6/2001 | Wong et al. | |
| 6,271,566 B1 | * 8/2001 | Tsuchiaki | 257/347 |
| 6,287,925 B1 | * 9/2001 | Yu | 438/301 |
| 6,344,669 B1 | * 2/2002 | Pan | 257/391 |
| 6,346,729 B1 | * 2/2002 | Liang et al. | 257/344 |
| 6,348,394 B1 | * 2/2002 | Mandelman et al. | 438/424 |
| 6,358,796 B1 | * 3/2002 | Lin et al. | 438/257 |
| 6,437,404 B1 | * 8/2002 | Xiang et al. | 257/347 |
| 2001/0000111 A1 | * 4/2001 | Blanchard | 257/286 |
| 2002/0142552 A1 | * 10/2002 | Wu | 438/301 |
| 2003/0136985 A1 | * 7/2003 | Murthy et al. | 257/288 |

* cited by examiner

Primary Examiner—Jerome Jackson
Assistant Examiner—Jesse A. Fenty

(57) ABSTRACT

The present invention provides a semiconductor device and a method of manufacture therefor. The semiconductor device includes a channel region located in a semiconductor substrate and a trench located adjacent a side of the channel region. The semiconductor device further includes an isolation structure located in the trench, and a source/drain region located over the isolation structure.

22 Claims, 21 Drawing Sheets

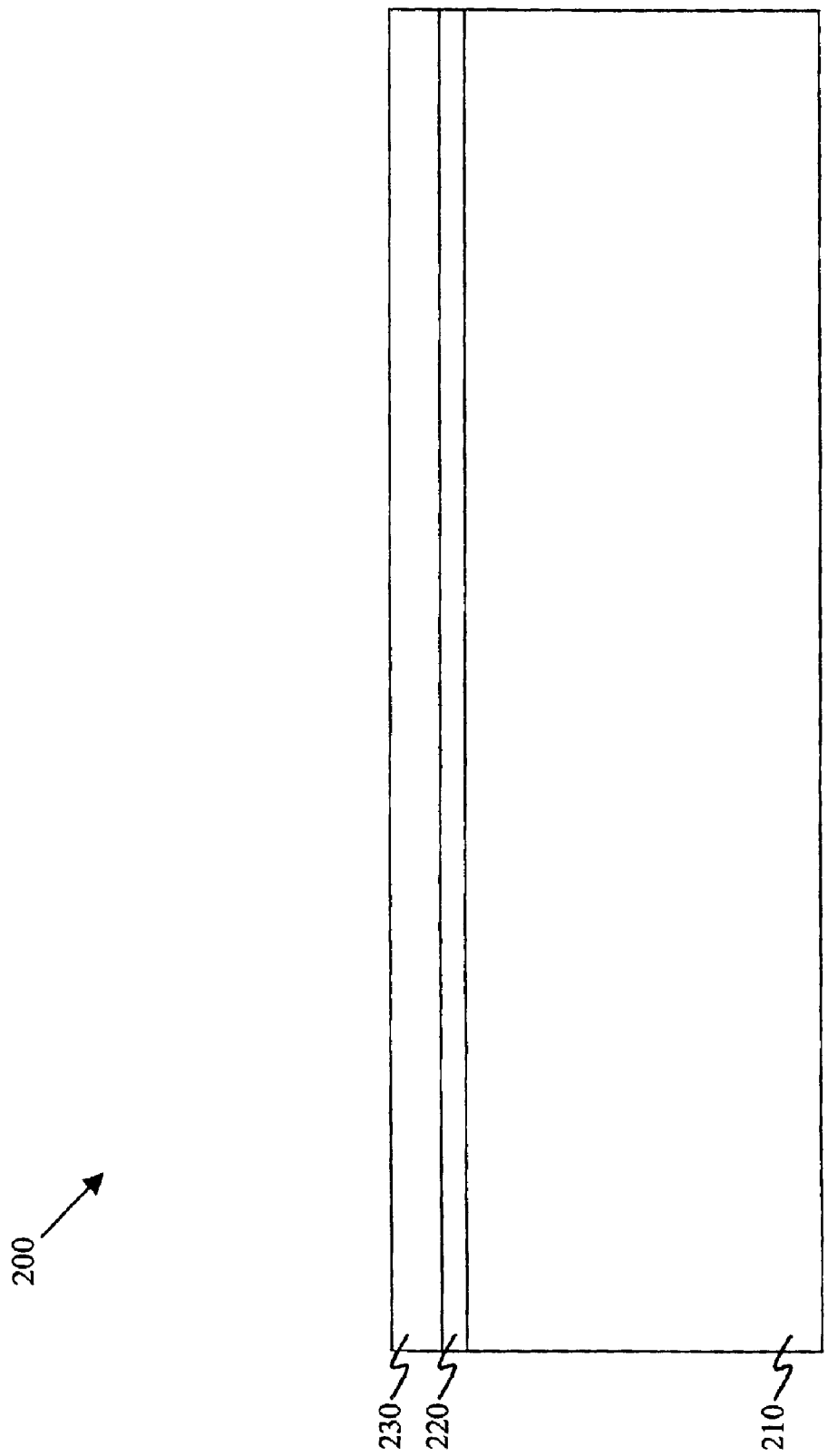

SEMICONDUCTOR DEVICE HAVING A GHOST SOURCE/DRAIN REGION AND A METHOD OF MANUFACTURE THEREFOR

TECHNICAL FIELD OF THE INVENTION

The present invention is directed, in general, to a semiconductor device and, more specifically, to a semiconductor device having a ghost source/drain region and a method of manufacture therefor.

BACKGROUND OF THE INVENTION

The advent of the integrated circuit has had a significant impact on various types of communication devices. The integrated circuit has been incorporated into both radio frequency applications and high speed communication network systems. While operation speeds of these communication devices have dramatically increased, the demand for yet faster communication devices continues to rise. Thus, the semiconductor manufacturing industry continually strives to increase the overall speed of the integrated circuit.

One way in which the semiconductor industry has increased the speed of the integrated circuit is to continue to shrink the size of the transistor. Over the last few years, the device size of the transistor has gone from 0.5 $\mu$m to 0.32 $\mu$m to 0.25 $\mu$m and now transistor device sizes are heading to the 0.10 $\mu$m range and below. With each decrease in size, however, the semiconductor industry has faced new challenges.

One of such challenges is that of reducing parasitic capacitance. As transistor geometries shrink, the time delay of signals propagating through the transistor are heavily influenced by the various parasitic capacitances inevitably associated with the structure, when fabricated according to the current state of the art. One of the principal remaining elements of transistor capacitance is the source-drain to substrate capacitance. This junction capacitance, as a function of area, is increasing as the technology advances. This is in part because one of the principal known failure mechanisms of a short channel transistor is controlled through the use of increased well doping. Increased well doping reduces the diode depletion layer thickness in the well, which increases unit capacitance.

Another challenge is reducing "cross-talk." As is well known, cross-talk results when electrical noise, created by transistor devices, travels through the capacitive coupling of the substrate and negatively affects the performance of opposing devices. Though cross-talk has been a well-known phenomenon, up until recently it was of less concern. However, as a result of the use of multi-gigahertz operating frequencies in today's RF devices, the significance of cross-talk has increased dramatically. In addition, with the increase in packing density and decrease in device size, transistor devices are being manufactured on the same chip and closer and closer together, which increases the relative effect of the cross-talk problem. Thus, as a result of the increased packing density and the decreased device sizes, both taken in conjunction with the cross-talk problems, device performance and integration issues are becoming increasingly apparent.

Silicon-on-insulator (SOI) already provides a solution to these problems. However, this approach can require the use of a very high current implanter and a very high thermal budget. The use of the very high current implanter and very high thermal budget generally leads to increased manufacturing time, complexity, and most importantly, increased manufacturing cost. Additionally, the use of SOI may result in the transistor device having a floating back gate. Since the back gate of the transistor device is floating, the operational voltages may float up or down, possibly rendering the device either non-conducting or conducting at all times. Because of the four aforementioned drawbacks of SOI, the semiconductor manufacturing industry is generally unwilling to use the SOI structure on many conventional semiconductor devices.

Accordingly, what is needed in the art is a transistor device and a method of manufacture thereof, that does not experience the parasitic capacitance and "cross-talk" problems associated with the prior art transistors, and does not require the expense, time and effort to fabricate SOI substrates.

SUMMARY OF THE INVENTION

To address the above-discussed deficiencies of the prior art, the present invention provides a semiconductor device and a method of manufacture therefor. The semiconductor device includes a channel region located in a semiconductor substrate and a trench located adjacent a side of the channel region. The semiconductor device further includes an isolation structure located in the trench, and a source/drain region located over the isolation structure.

The foregoing has outlined preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form.

BRIEF DESCRIPTION OF THE DRAWINGS

The invention is best understood from the following detailed description when read with the accompanying FIGUREs. It is emphasized that in accordance with the standard practice in the semiconductor industry, various features are not drawn to scale. In fact, the dimensions of the various features may be arbitrarily increased or reduced for clarity of discussion. Reference is now made to the following descriptions taken in conjunction with the accompanying drawings, in which:

FIG. 2 illustrates a semiconductor substrate, after formation of a thin etch stop layer thereon;

DETAILED DESCRIPTION

Figure 1A:
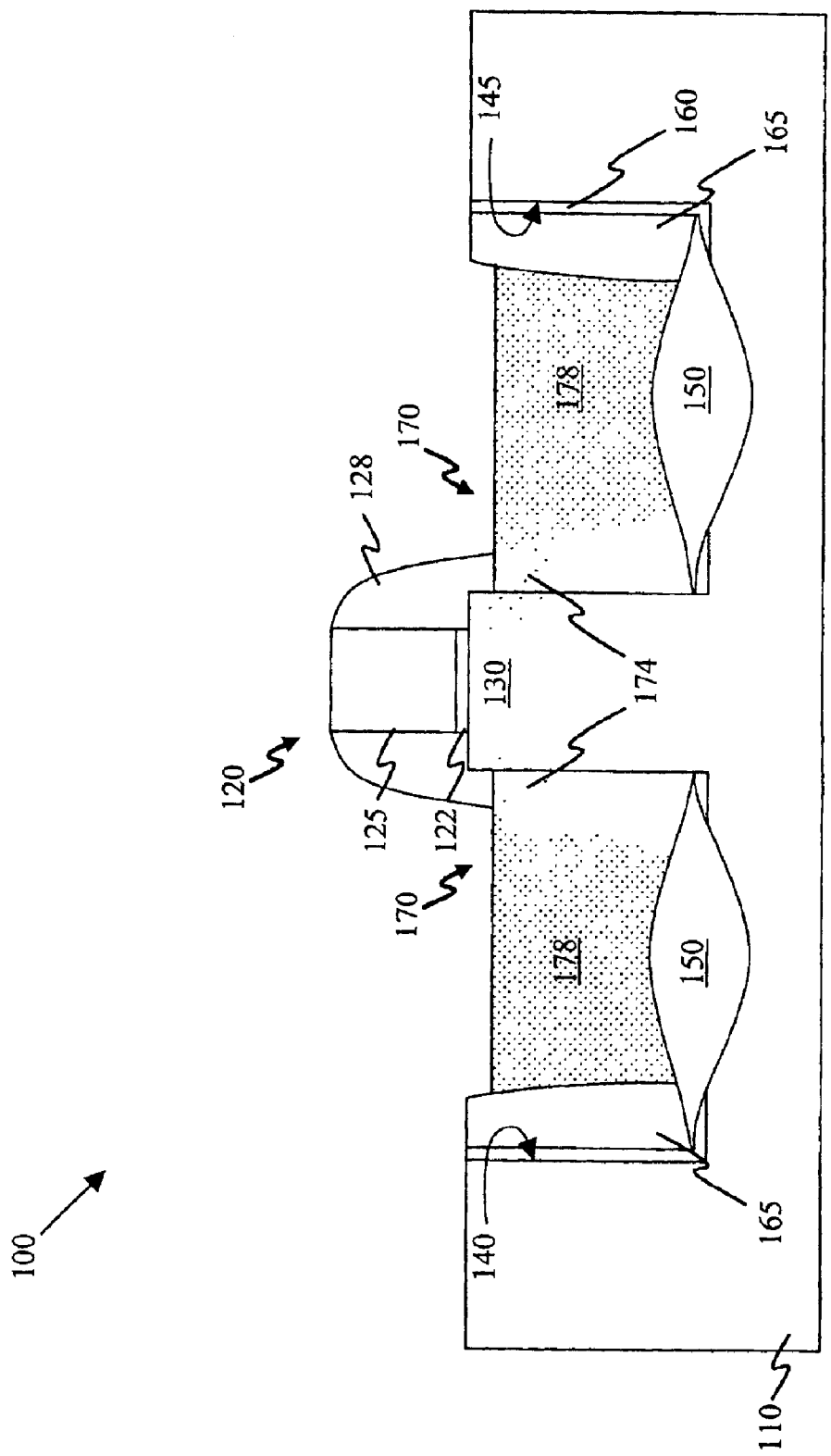
FIG. 1A illustrates a completed semiconductor device, constructed in accordance with the present invention.

Referring initially to FIG. 1A, illustrated is a cross-sectional view of one advantageous embodiment of a completed semiconductor device 100, manufactured according to the method described below. FIG. 1A illustrates the completed semiconductor device 100, including a semiconductor substrate 110. The semiconductor substrate 110 may be any layer located in a semiconductor device, including a layer located at the wafer level or a layer located above wafer level.

The semiconductor device 100 illustrated in FIG. 1A, further includes a transistor gate 120 located over the semiconductor substrate 110. In the illustrative embodiment shown in FIG. 1A, the transistor gate 120 includes a gate oxide 122, a gate electrode 125 and gate sidewall spacers 128. Other devices, which are not shown, may also be included within the transistor gate 120. Located in the semiconductor substrate 110 and under the transistor gate 120, is a channel region 130.

The semiconductor device 100 may further include first and second trenches 140, 145, located on opposing sides of the channel region 130. In the illustrative embodiment shown in FIG. 1A, isolation structures 150 are formed in each of the first and second trenches 140, 145. The isolation structures 150, in one advantageous embodiment, comprise an oxide. In another embodiment, an oxide layer 160 and a nitride layer 165 are located on a sidewall of each of the trenches 140, 145.

The semiconductor device 100 further includes source/drain regions 170 located over each of the isolation structures 150. In the illustrative embodiment shown in FIG. 1A, the source/drain regions 170 comprise lightly doped source/drain regions 174 and source/drain contact regions 178. Depending on whether the semiconductor device is a P-type metal oxide semiconductor (PMOS) device or an N-type metal oxide semiconductor (NMOS) device, the source/drain regions 170 may be doped with boron or phosphorous, respectively.

The completed semiconductor device 100 illustrated in FIG. 1A, experiences reduced parasitic capacitance and resistance, as compared to the prior art semiconductor devices. This is a result of the source/drain regions 170 being substantially isolated from the substrate 110 and other possible capacitances, by the isolation structures 150. In one embodiment, only an edge of the source/drain regions 170 contribute to the junction capacitance of the semiconductor device 100, thus, the term ghost/source drain region applies. The isolation structures 150, in a preferred embodiment, are oxide structures which are substantially thicker than the source/drain junction depletion regions which would otherwise exist, resulting in a substantially lower capacitive coupling.

The oxide layer 160 and nitride sidewall spacer 165 also help to reduce parasitic capacitance. Moreover, the isolation structures 150, the oxide layers 160 and the nitride sidewall spacers 165 not only reduce parasitic capacitance, but they substantially reduce "cross-talk" caused by transistors and other electrically noisy devices. Additionally, since the isolation structures 150 do not extend under the channel region 130, the semiconductor device 100 does not experience the floating back gate problems experienced by some of the prior art devices, namely silicon-on-insulator (SOI) structures. Moreover, the completed semiconductor device 200 is capable of attaining field oxide breakdown voltages of up to about 30 volts or higher, as compared to about 6 volts in the prior art semiconductor devices.

Figure 1B:
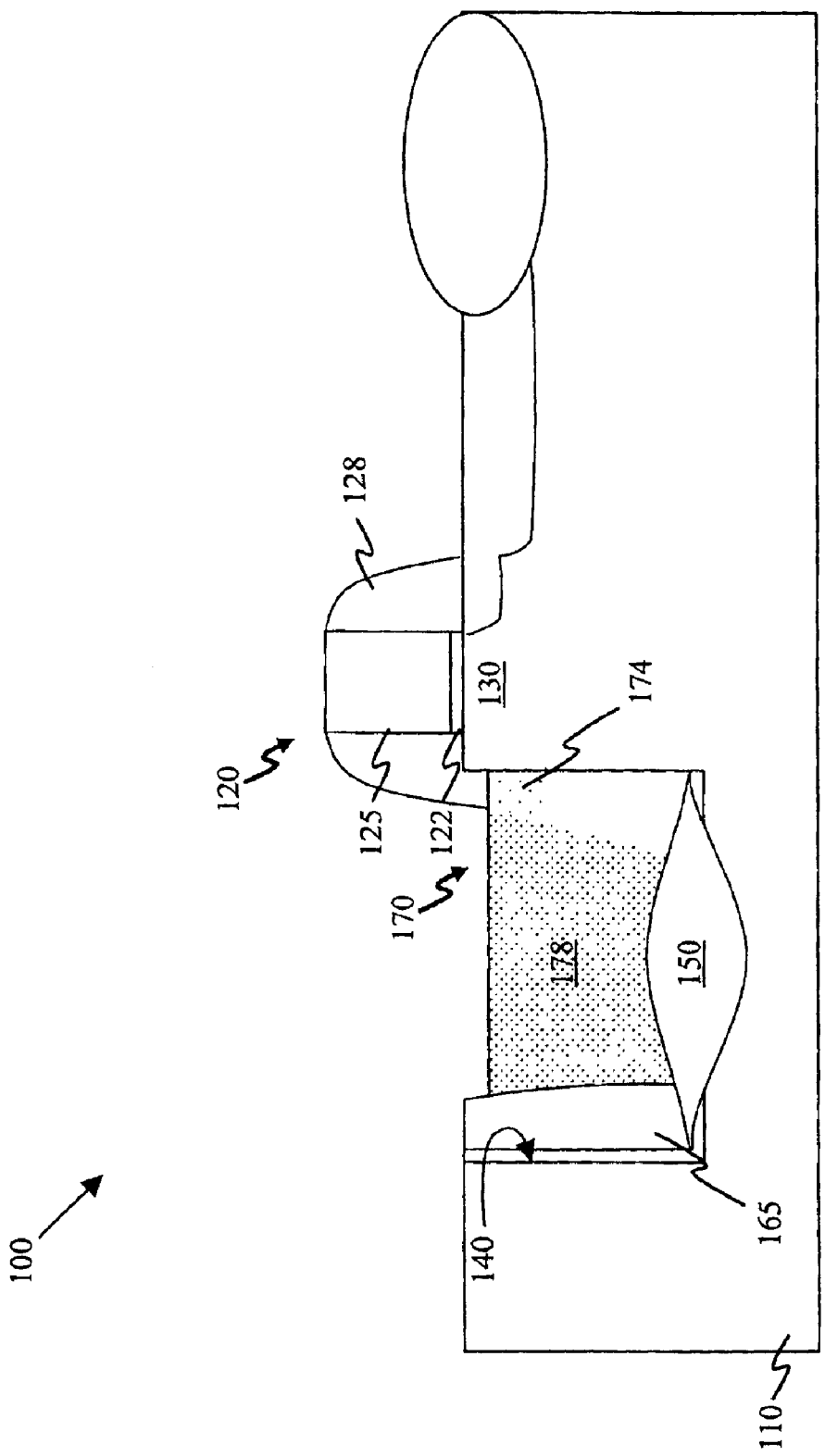
FIG. 1B illustrates an alternative embodiment of a completed semiconductor device, constructed in accordance with the present invention.

While the embodiment illustrated in FIG. 1A has been discussed as having both first and second trenches 140, 145, one skilled in the art understands that an embodiment including only a single trench, is also within the scope of the present invention. Such an embodiment is shown in FIG. 1B. As illustrated, the single trench could be located under a drain of the semiconductor device 100. A source of the device could then be manufactured in a conventional fashion, for example, using LOCOS isolation. The use of the single trench may be suitable for many digital circuits where the source is connected to a power supply rail, while a capacitance of the drain has to be minimized for high speed applications. It should be noted, however, that the inverse also holds true, for example, where the source is located within the single trench, and the drain is conventionally formed.

Turning now to FIGS. 2–19, with continued reference to FIG. 1A, illustrated are detailed manufacturing steps instructing how one might, in a preferred embodiment, manufacture a device similar to the completed semiconductor device 100 depicted in FIG. 1A. FIG. 2 illustrates a semiconductor substrate 210 after formation of a thin etch stop layer 220, using a conventional chemical vapor deposition (CVD) or other similar process. As illustrated, the etch stop layer 220 is formed over the entire surface of the semiconductor substrate 210. Furthermore, in an exemplary embodiment, the etch stop layer 220 is a silicon nitride etch stop layer having a thickness of about 30 nm. Theoretically, the etch stop layer 220 may have a dual function, not only acting as an etch stop layer, but also preventing oxidation of the semiconductor substrate 210. In one particularly advantageous embodiment, the semiconductor substrate 210 is a single crystal silicon semiconductor substrate.

In an exemplary embodiment, formed over the etch stop layer 220 is an oxide layer 230. The oxide layer 230 may be deposited using a conventional CVD, spin on glass (SOG), or other similar process. In an exemplary embodiment, the oxide layer 230 is about 100 nm thick. Moreover, the oxide layer 230 may be a sacrificial layer that will be removed in a subsequent processing step.

Figure 3:
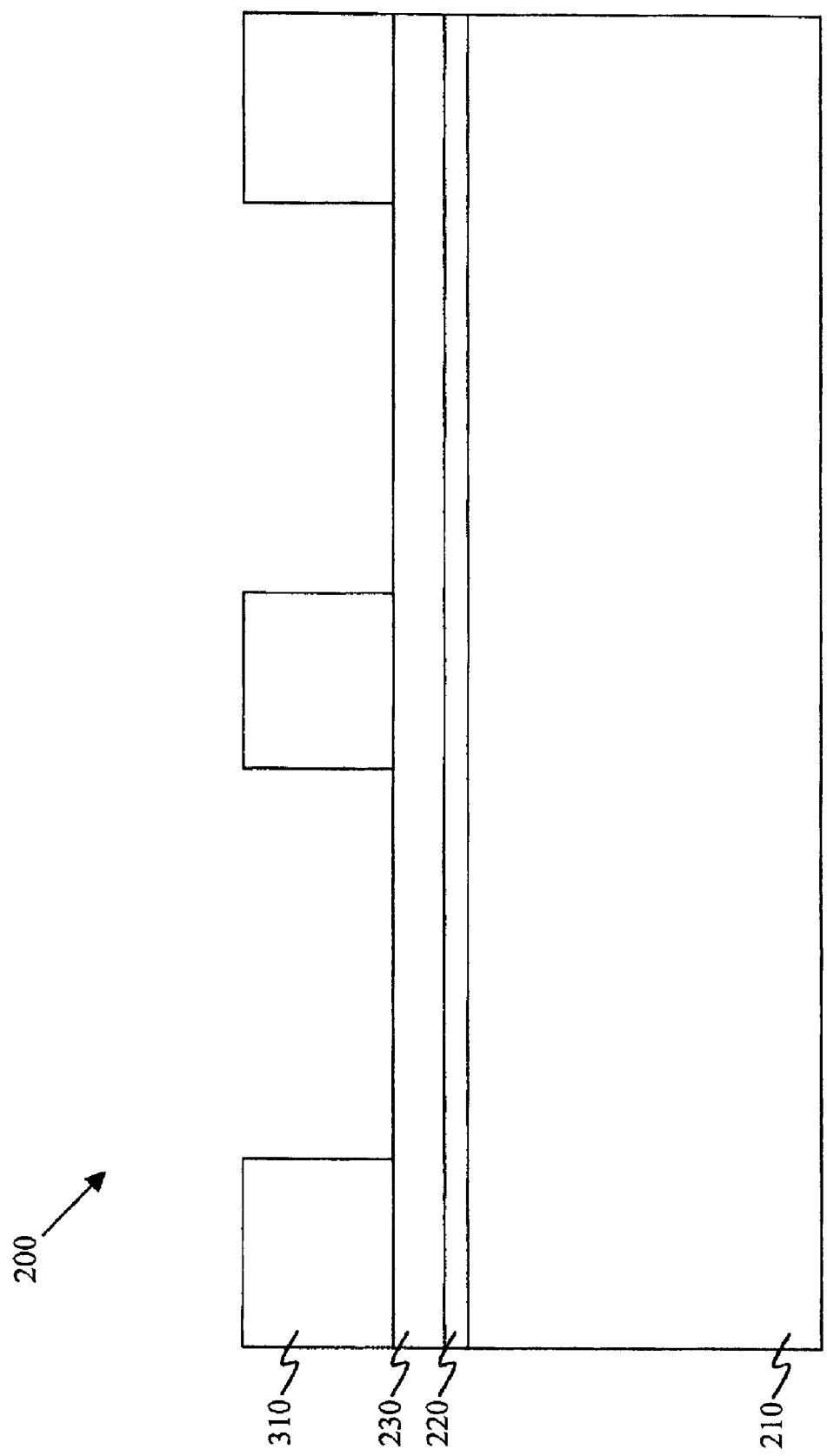
FIG. 3 illustrates the formation of photoresist portions over the surface of the partially completed semiconductor device illustrated in FIG. 2.
Figure 4:
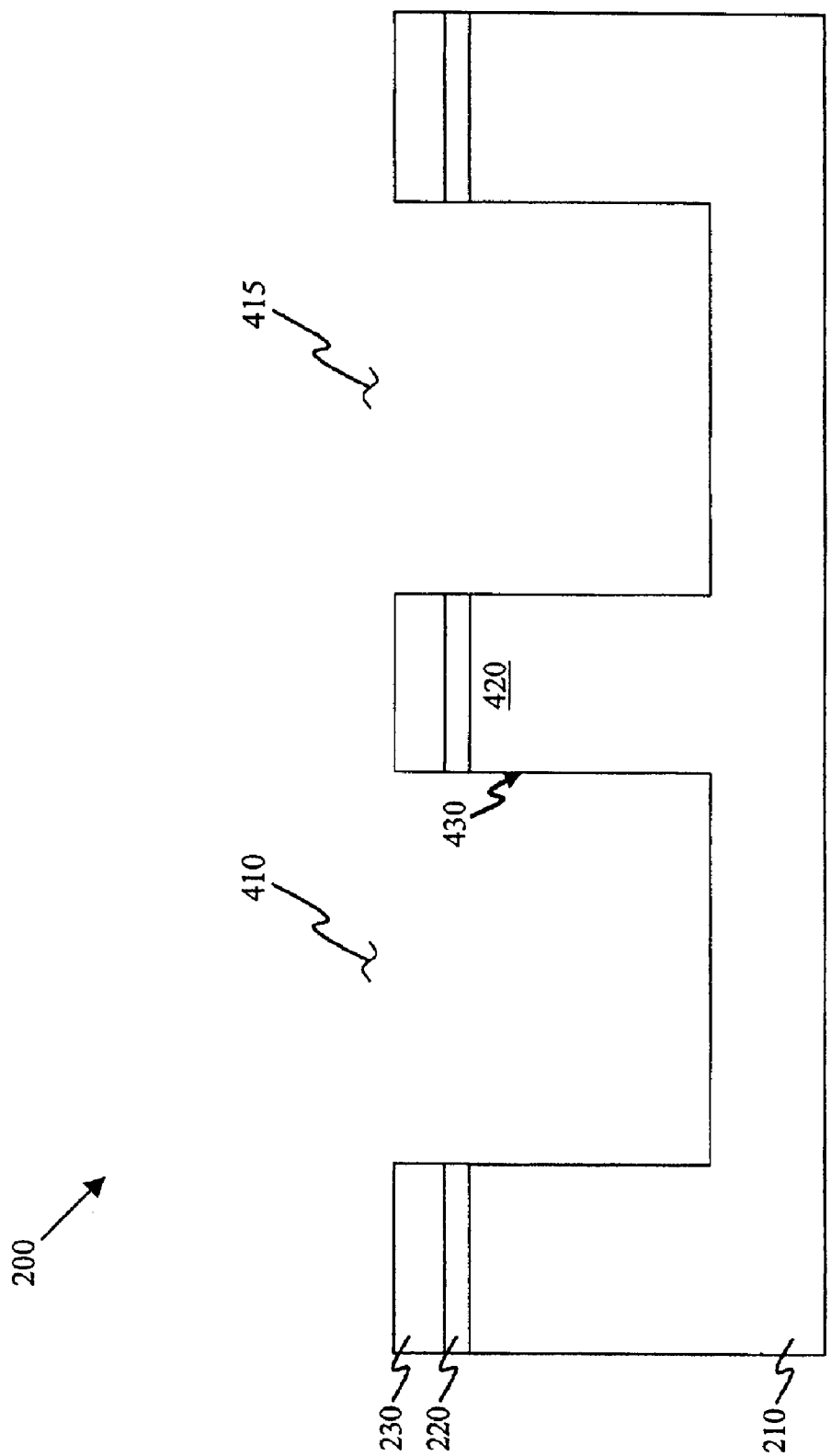
FIG. 4 illustrates the formation of first and second trenches within the partially completed semiconductor device.

Turning to FIG. 3, with continued reference to FIG. 2, illustrated is the formation of photoresist portions 310. One skilled in the art understands how to manufacture photoresist portions 310, including depositing a blanket layer of photoresist material, and subsequently patterning and developing the blanket layer, resulting in the photoresist portions 310. The photoresist portions define first and second trenches (FIG. 4). The location and spacing of the photoresist portions 310 depend on various design parameters, namely the spacing and width of the first and second trenches (FIG. 4).

Turning to FIG. 4, illustrated is the formation of first and second trenches 410, 415, within the partially completed semiconductor device 200 illustrated in FIG. 3. The first and second trenches 410, 415, upon completion of the partially completed semiconductor device 200, may include source/drain regions therein. The first and second trenches 410, 415, may be formed in many ways, but in an exemplary embodiment, a first dielectric trench etch is used to remove a portion of the desired oxide layer 230 and etch stop layer 220, and a second silicon trench etch is used to produce the first and second trenches 410, 415, having a desired depth, in the semiconductor substrate 210. In an alternative embodiment, however, the first dielectric trench etch is only used to remove a portion of the oxide layer 230, and the second silicon trench etch is used to remove a portion of the etch stop layer 220 and to produce the first and second trenches 410, 415, within the semiconductor substrate 210. The depth of the first and second trenches 410, 415, should be kept as shallow as possible, thus, reducing punch through current without impairing the ability of the metallization process to produce metal contacts with minimal contact resistance. In one particular embodiment, a depth of less than about 1000 nm is desirable for the first and second trenches 410, 415. Subsequent to forming the first and second trenches 410, 415, the photoresist portions 310 should be removed.

After removing the photoresist portions 310, a remaining post portion 430 may be conventionally doped, forming a channel region 420 between the first and second trenches 410, 415. In one exemplary embodiment, the channel region 420 may include a dopant concentration ranging from about 1E16 atoms/cm$^3$ to about 1E17 atoms/cm$^3$. It should be noted, however, that other concentrations are within the scope of the present invention. Additionally, the channel region 420 may be doped with a P-type dopant or an N-type dopant, depending on the design of the device. While the channel region 420 has been formed in the current step, one skilled in the art understands that it may be formed at various times during the manufacturing process.

Figure 5:
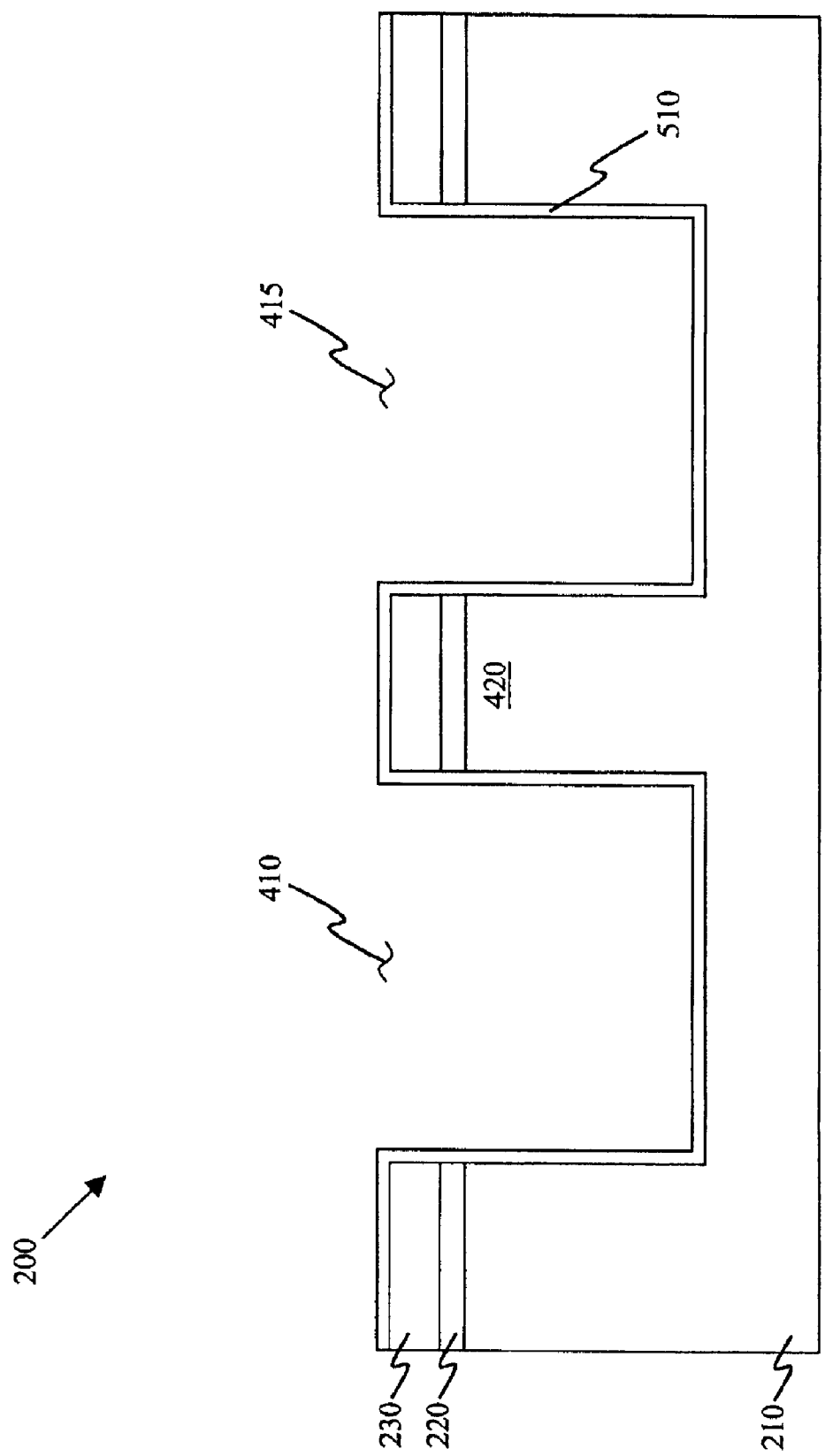
FIG. 5 illustrates the formation of a stress relief pad oxide around the trench bottom and trench sidewalls.

Turning to FIG. 5, illustrated is the formation of a stress relief pad oxide 510 around the trench bottom and trench sidewalls. The stress relief pad oxide 510 may be formed using conventional pad oxide formation processes. For example, the stress relief pad oxide 510 could be formed by a light oxidation process, oxide deposition process or other similar known process. The details of forming the stress relief pad oxide 510 are well known in the art, therefore, the process will not be described in greater detail. The thickness of the stress relief pad oxide 510, in comparison to a thin layer of nitride (described below), is a critical element. The thickness of the stress relief pad oxide 410 should be predetermined such that it reduces the vertical stress placed upon the semiconductor substrate by a sidewall spacer and an isolation structure 810 (FIG. 8), formed in the following FIGURES. For example, in an advantageous embodiment, the stress relief pad oxide 510 has a thickness of about 15 nm.

Figure 6:
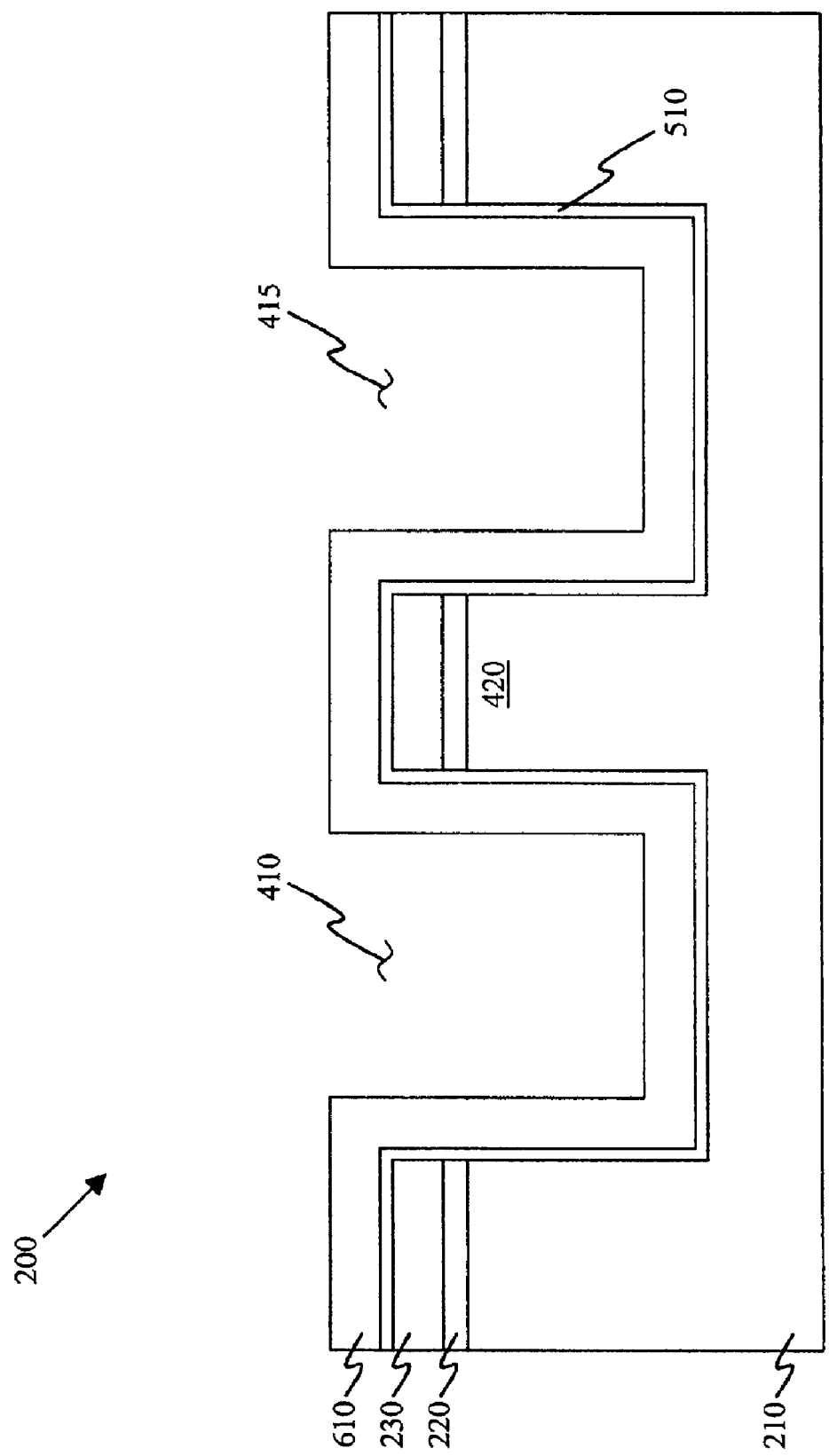
FIG. 6 illustrates the partially completed semiconductor device illustrated in FIG. 5, after depositing a thin layer of nitride over the surface and within the first and second trenches.

Turning to FIG. 6, illustrated is the partially completed semiconductor device 200 illustrated in FIG. 5, after depositing a thin layer of nitride 610 over the surface and within the first and second trenches 410, 415. In an illustrative embodiment, it is desired for the thin layer of nitride 610 to have a thickness of about 80 nm; however, other thicknesses are also within the scope of the present invention. Conventional methods may be used to manufacture the thin layer of nitride 610.

Figure 7:
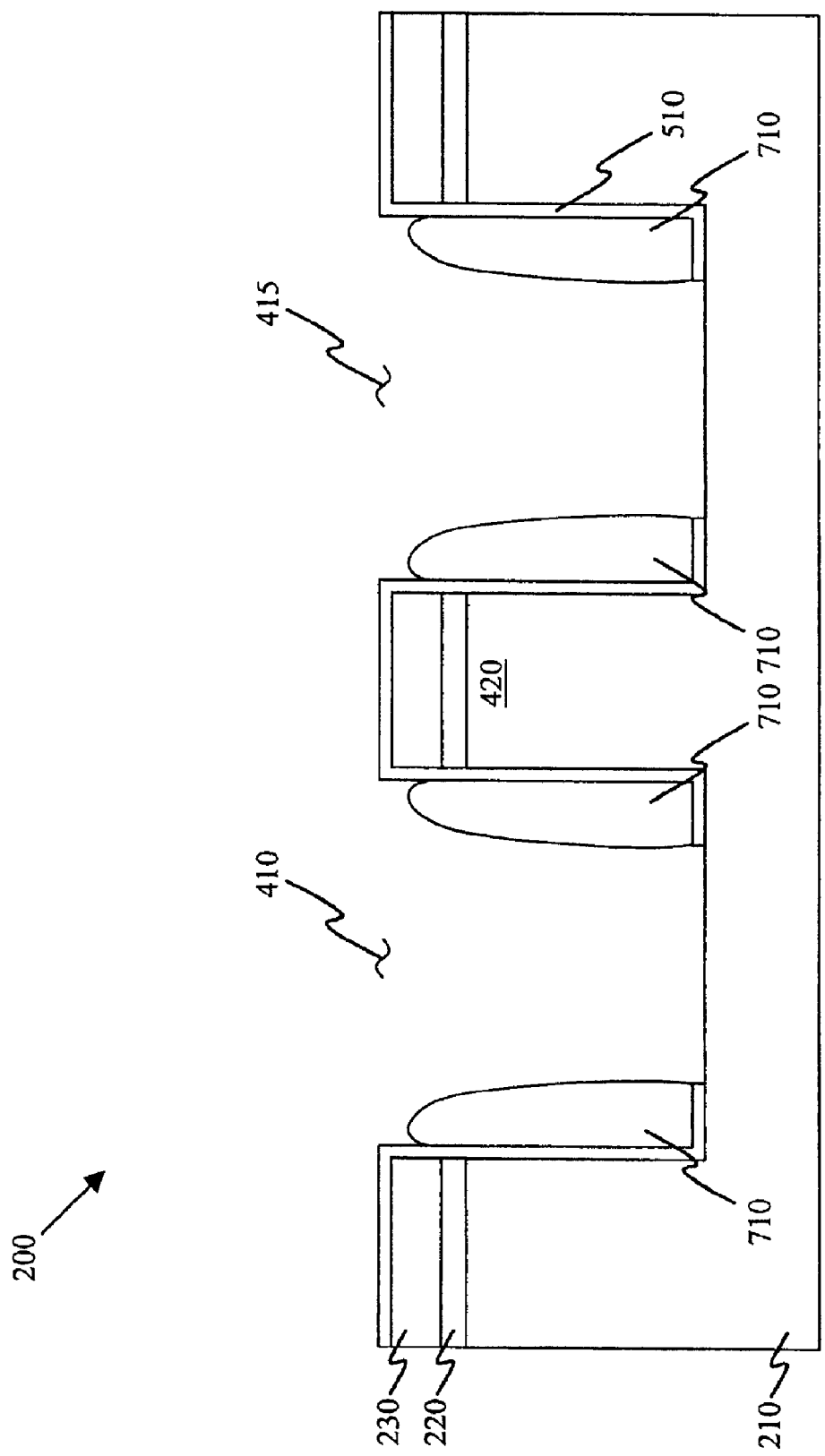
FIG. 7 illustrates the partially completed semiconductor device illustrated in FIG. 6, after performing a traditional anisotropic etch.

Turning briefly to FIG. 7, illustrated is the partially completed semiconductor device 200 illustrated in FIG. 6, after performing a traditional anisotropic etch. The traditional anisotropic etch, as one skilled in the art already knows, removes those materials on horizontal surfaces. In the particular embodiment shown in FIG. 7, the anisotropic etch forms sidewall spacers 710 within the first and second trenches 410, 415.

Figure 8:
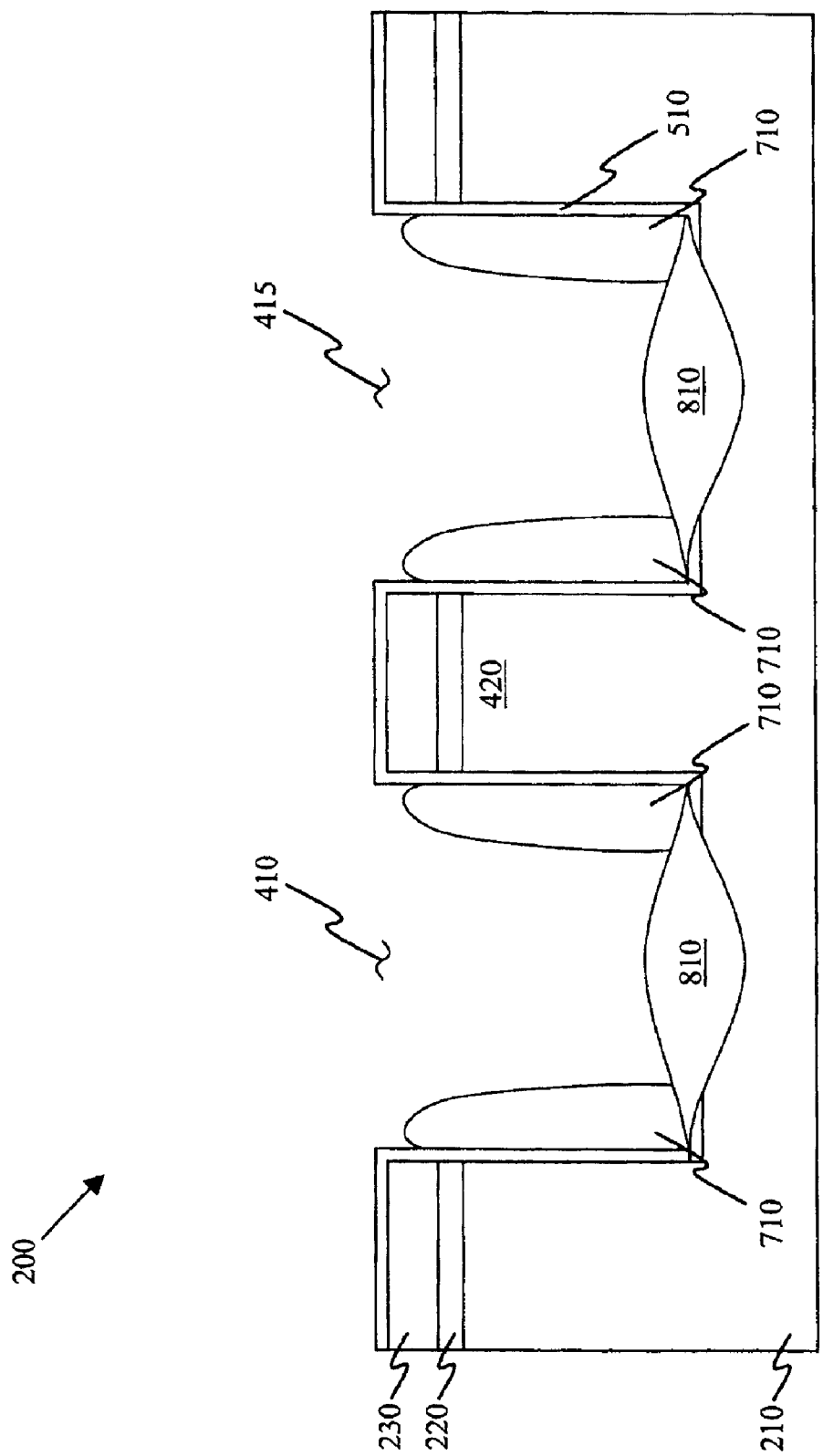
FIG. 8 illustrates the partially completed semiconductor device shown in FIG. 7, after formation of an isolation structure in each of the first and second trenches.

Turning to FIG. 8, illustrated is the partially completed semiconductor device 200 shown in FIG. 7, after the formation of an isolation structure 810 in each of the first and second trenches 410, 415. In one illustrative embodiment, the isolation structures 810 have a thickness ranging from about 100 nm to about 200 nm, and more specifically, a thickness of about 150 nm. The isolation structures 810 may be used, once the device is completed, to substantially isolate source/drain regions of the semiconductor device from the semiconductor substrate 210, and also to reduce cross-talk between the semiconductor device and other semiconductor devices on the chip.

Figure 9:
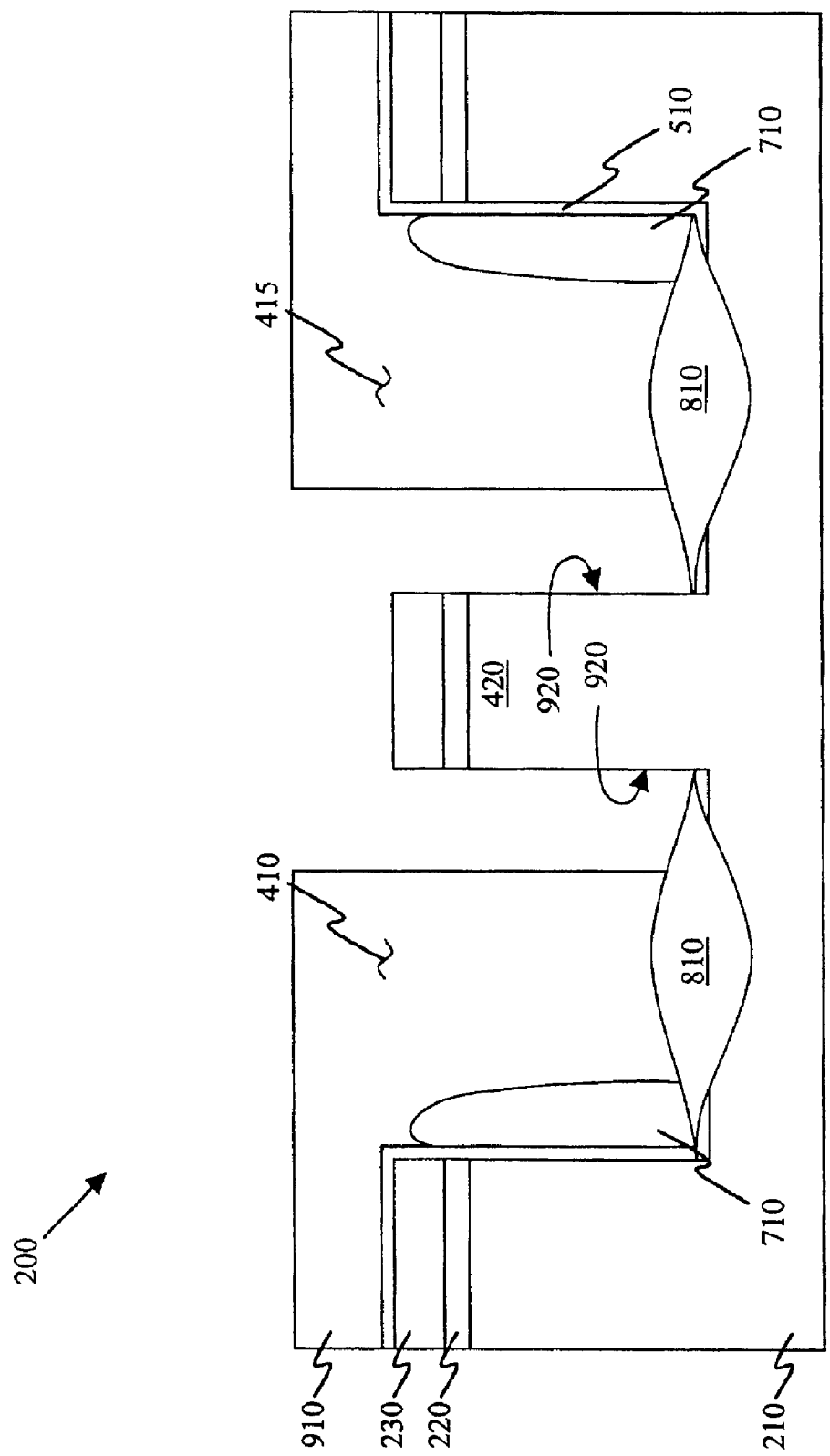
FIG. 9 illustrates the partially completed semiconductor device of FIG. 8, undergoing removal of the nitride sidewall spacers and stress relief oxide from an inner wall of each of the first and second trenches.

Turning to FIG. 9, illustrated is the partially completed semiconductor device 200 of FIG. 8, undergoing removal of the nitride sidewall spacers 710 and stress relief oxide 510 from an inner wall of each of the first and second trenches 410, 415. To remove the nitride sidewall spacers 710 and the stress relief oxide 510 from an inner wall of each of the first and second trenches 410, 415, a conformal layer of photoresist is deposited, patterned and developed, leaving a photoresist portion 910 shown in FIG. 9. A conventional etch and removal of the sidewall spacers 710 and the stress relief oxide 510 from the first and second trenches 410, 415, can then be conducted, resulting in exposed inner walls 920 of the first and second trenches 410, 415. The exposed inner walls 920 may allow electrical contact to exist between the channel region 420 and the source/drain regions (formed in a subsequent step).

In an optional step, after the removal of the sidewall spacer 710 and a portion of the stress relief pad oxide 510, the exposed walls 920 may be subjected to a special sidewall clean to remove remaining residues. For instance, a wet oxidation of about 20 nm followed by an oxide strip, could be used to clean the exposed walls 920. It should be noted that if the wet oxidation and wet oxidation oxide strip cleaning process were used, the thickness of the isolation structures 810 should be sufficient to withstand both the stress relief pad oxide wet etch and the wet oxidation oxide strip. After the nitride sidewall spacers 710 and pad oxide 510 have been removed from the inner walls of the first and second trenches 410, 415, and the exposed walls 920 are sufficiently clean, the photoresist portion 910 may be removed using conventional techniques.

Figure 10:
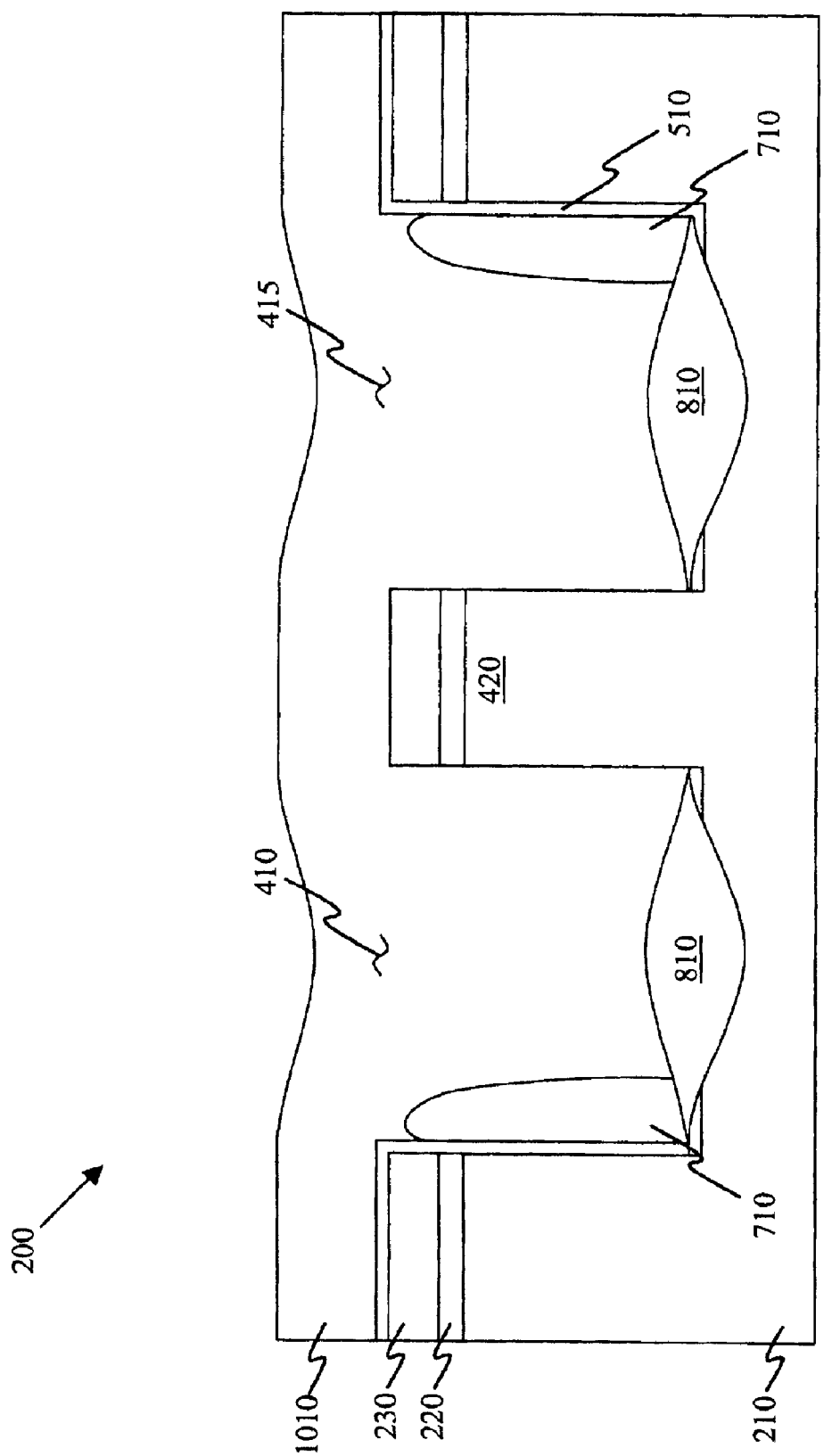
FIG. 10 illustrates the formation of a layer of polysilicon over the surface, and within the first and second trenches, of the partially completed semiconductor device illustrated in FIG. 9.

Turning to FIG. 10, illustrated is the formation of a layer of polysilicon 1010 within the first and second trenches 410, 415, of the partially completed semiconductor device 200 illustrated in FIG. 9. The layer of polysilicon 1010 may be formed using many processes, including chemical vapor deposition (CVD), physical vapor deposition (PVD), or other similar processes. In one particularly advantageous embodiment, the layer of polysilicon 1010 is a doped layer of polysilicon. The particular dopant used, would depend on whether the completed semiconductor device 100 (FIG. 1A) is a PMOS device or an NMOS device.

Figure 11:
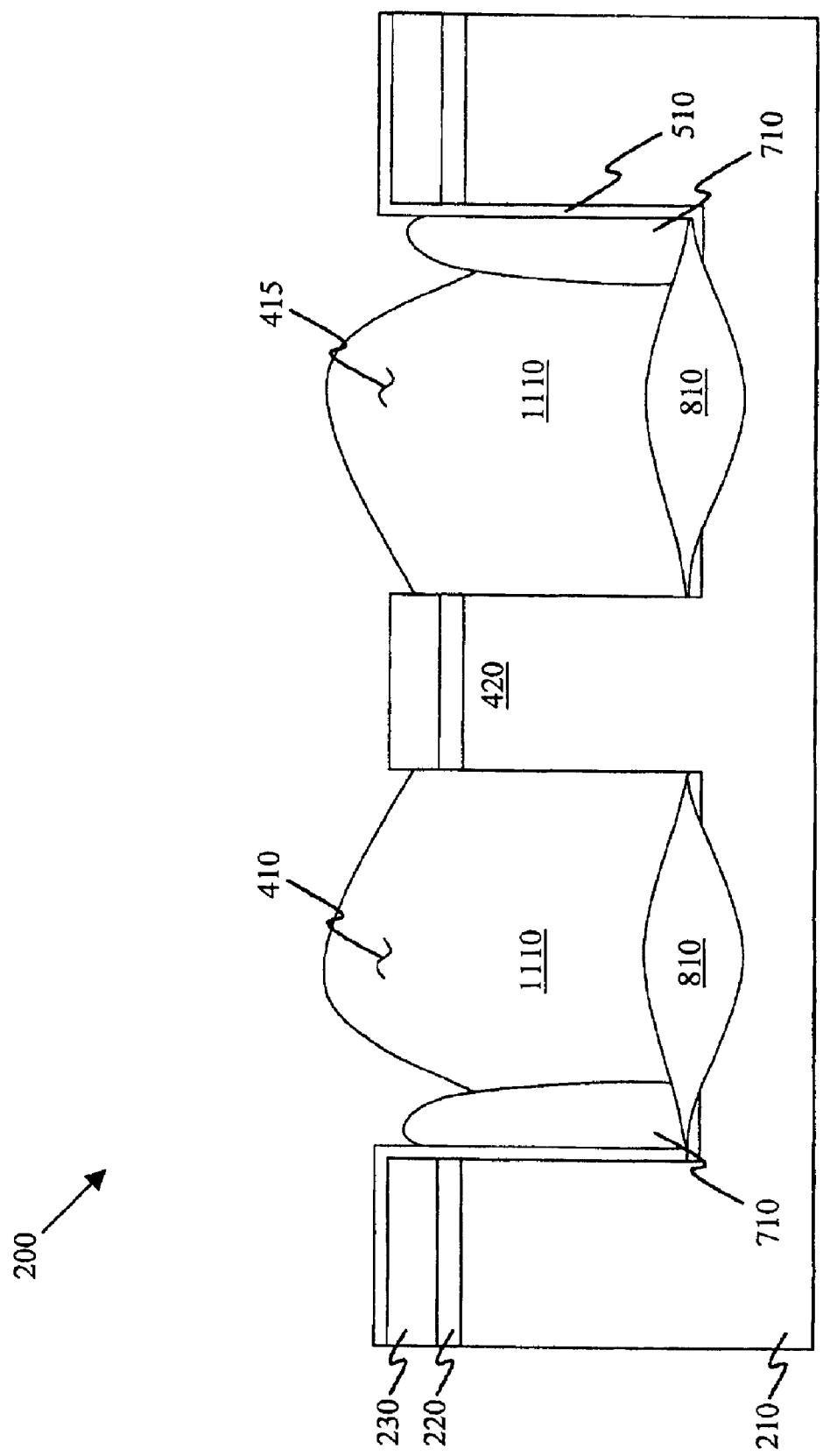
FIG. 11 illustrates an alternative method of forming epitaxial or single crystal layers within the first and second trenches.

Turning to FIG. 11, illustrated is an alternative method of forming epitaxial or single crystal layers 1110 within the first and second trenches 410, 415. To form the epitaxial or single crystal layers 1110, the partially completed semiconductor device 200 illustrated in FIG. 9, may be placed within an ultra-clean environment and exposed to a dopant gas. The dopant gas, depending on the particular device desired, could be a silane gas mixed with phosphine, or diborane. The dopant gas should react with the single crystal silicon present in the expose walls 920 of the first and second trenches 410, 415, and grow the epitaxial or single crystal layer 1110 outwards. Fortunately, the control of concentration profiling possible with epitaxy, is superior to many methods, thus, the final device could have a relatively well controlled doping profile.

Figure 12:
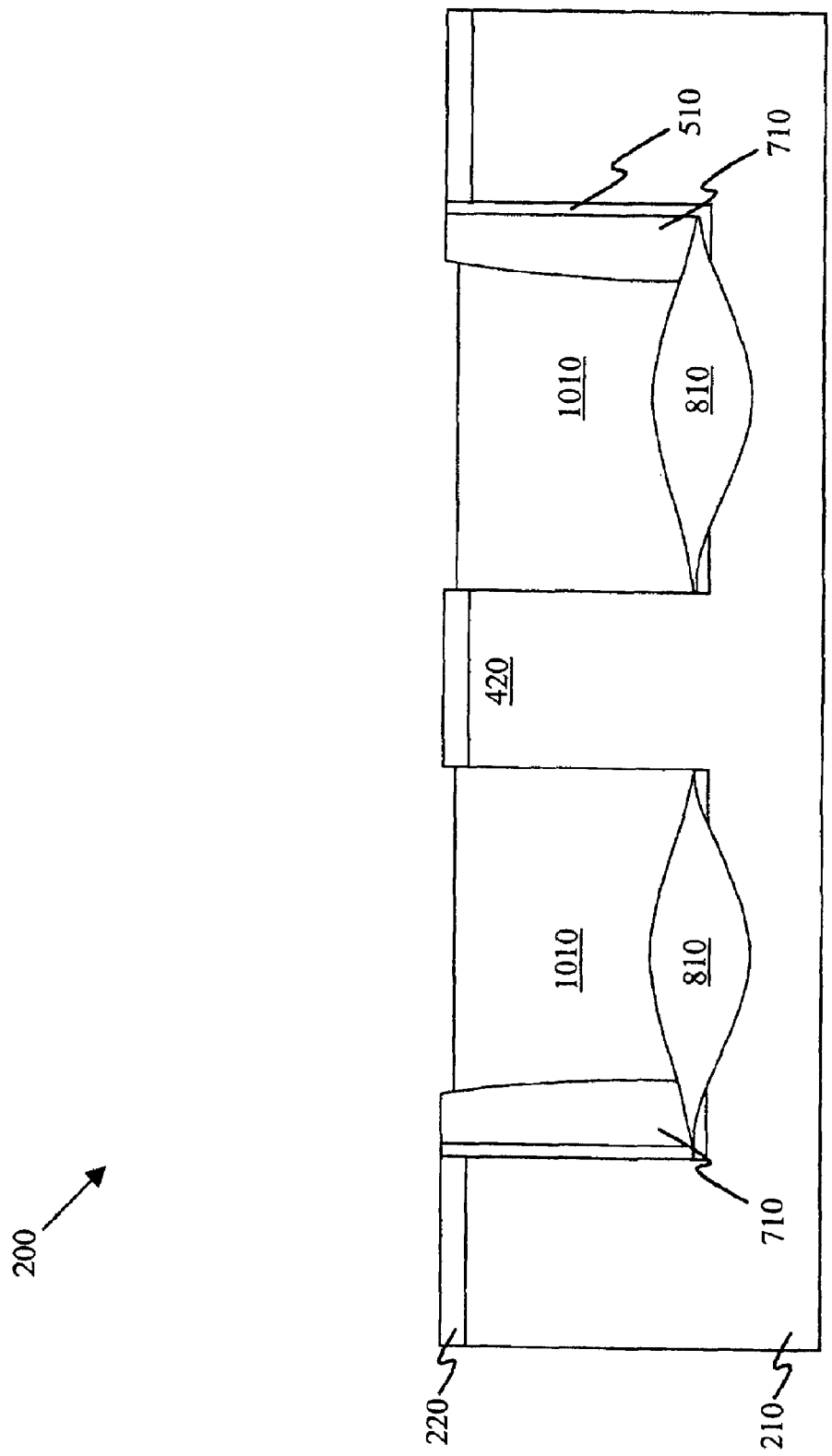
FIG. 12 illustrates the partially completed semiconductor device illustrated in FIGS. 10 and 11 (after a conventional chemical mechanical planarization (CMP) process.

Turning to FIG. 12, illustrated is the partially completed semiconductor device illustrated in FIGS. 10 and 11, after a conventional chemical mechanical planarization (CMP) or other similar process. The remainder of the discussion will be directed to the embodiment illustrated in FIG. 10, however, one skilled in the art understands that the following steps may also be applied to the epitaxial or single crystal layer 1110 embodiment, illustrated in FIG. 11. In the illustrative embodiment, the CMP process removes the sacrificial oxide layer 230 and the excess polysilicon 1010. As illustrated in FIG. 12, the polysilicon layer 1010 remains in the first and second trenches 410, 415, but is removed from areas above the etch stop layer 220.

Figure 13:
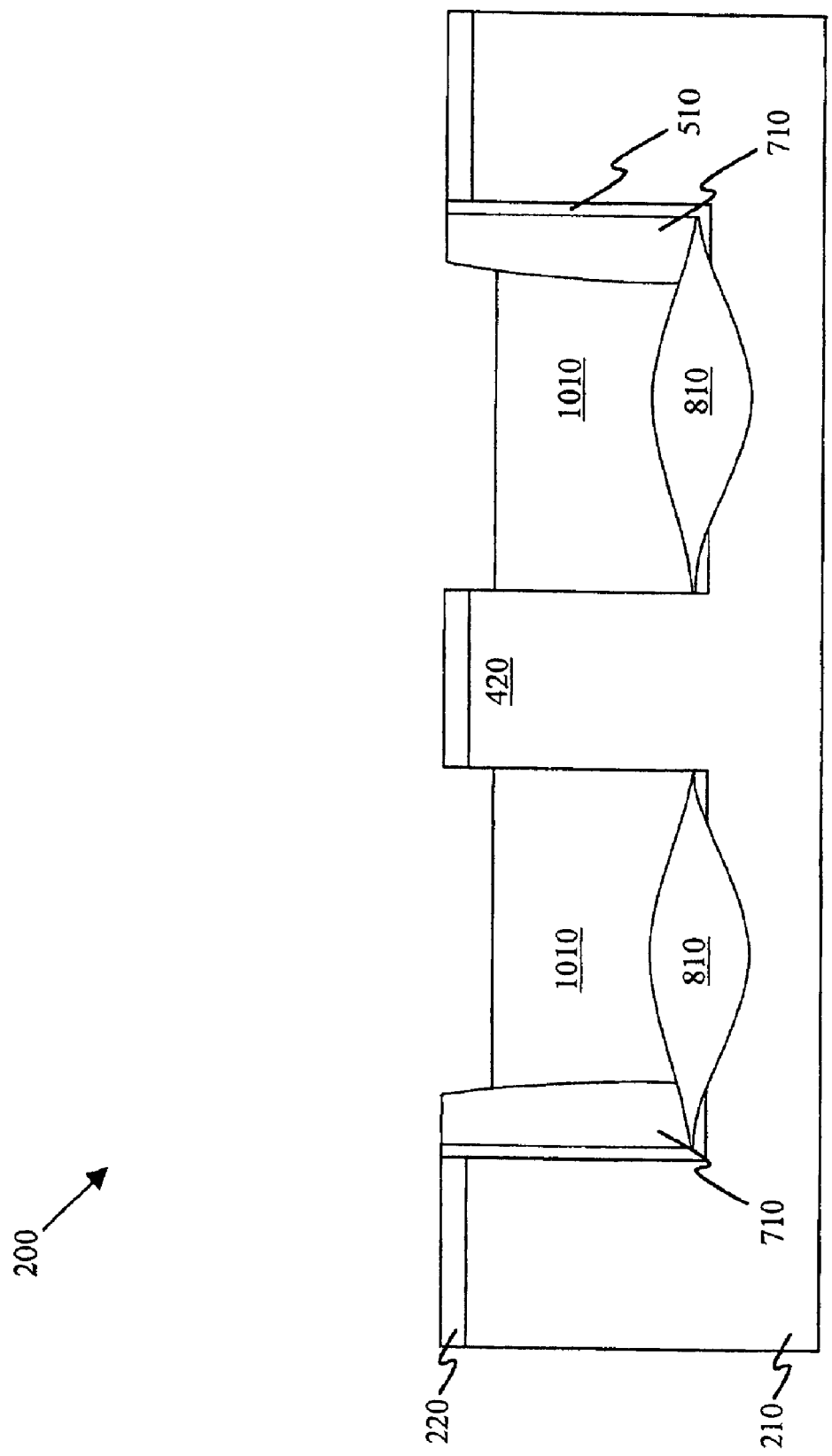
FIG. 13 illustrates the partially completed semiconductor device illustrated in FIG. 12, after an optional source/drain oxidation process.

Turning briefly to FIG. 13, illustrated is the partially completed semiconductor device 200 illustrated in FIG. 12, after an optional source/drain oxidation process. This may be done in order to reduce the excess polysilicon layer 1010 which protrudes above the surface of the channel region 420 when the etch stop layer 220 is removed. The optional source/drain oxidation process may further include a thickness reduction of the polysilicon layer 1010. In an exemplary embodiment, the oxidized polysilicon layer 1010 is removed using a buffered hydrofluoric etch. However, one having skill in the art knows that other similar removal techniques could be used to remove a portion of the polysilicon layer 1010.

Figure 14:
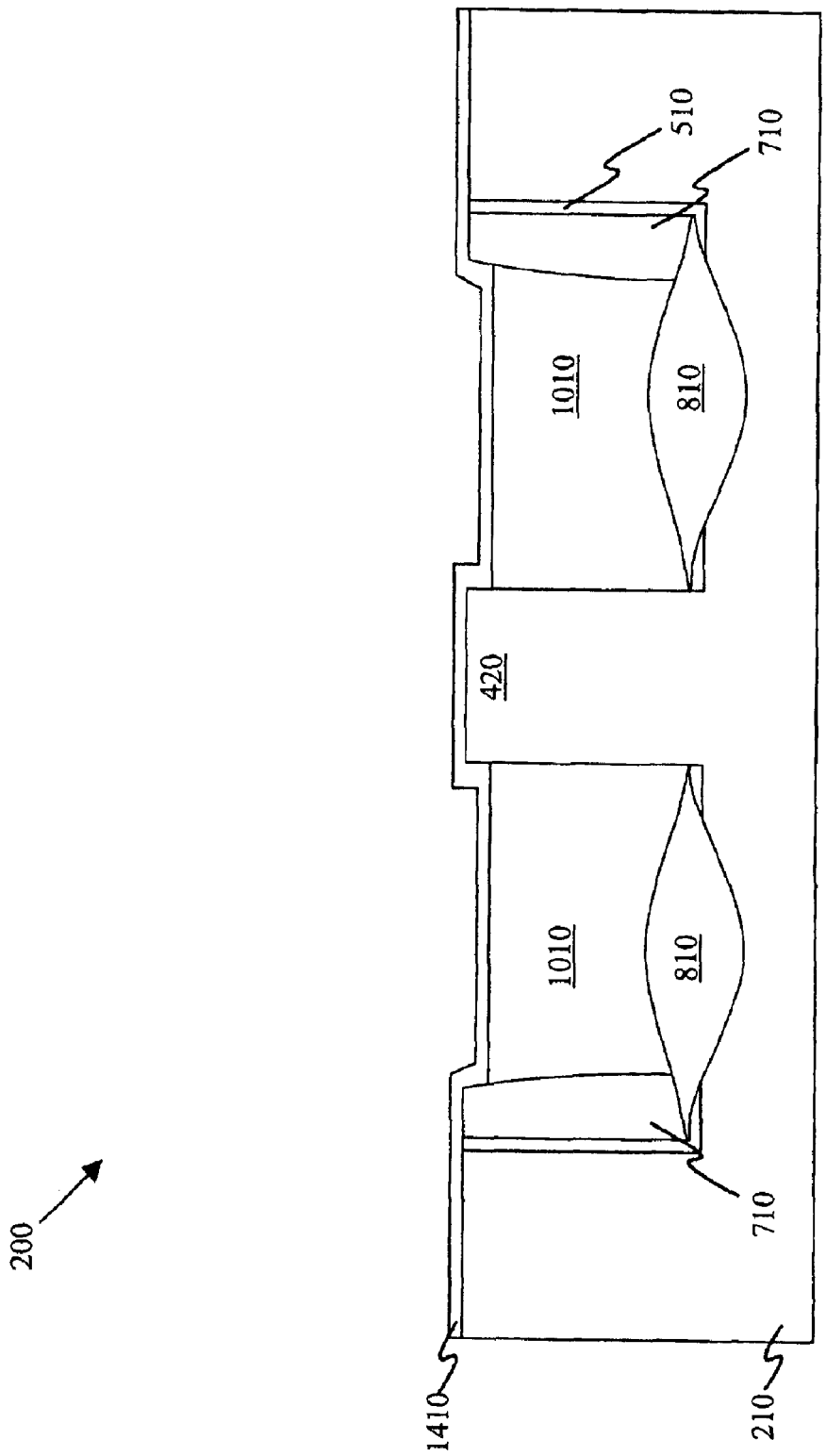
FIG. 14 illustrates the partially completed semiconductor device illustrated in FIG. 13, after formation of a gate oxide layer.

Turning to FIG. 14, illustrated is the partially completed semiconductor device 200, after formation of a gate oxide layer 1410. One skilled in the art understands how to form such a gate oxide layer 1410, and further understands the precision and skill that typically need be used to manufacture the gate oxide layer 1410, including any required preparation steps. In an advantageous embodiment, the gate oxide layer 1410 is formed to a thickness of about 10 nm or less. As illustrated, the gate oxide layer 1410 may be formed as a blanket layer over the entire surface of the partially completed semiconductor device 200.

Figure 15:
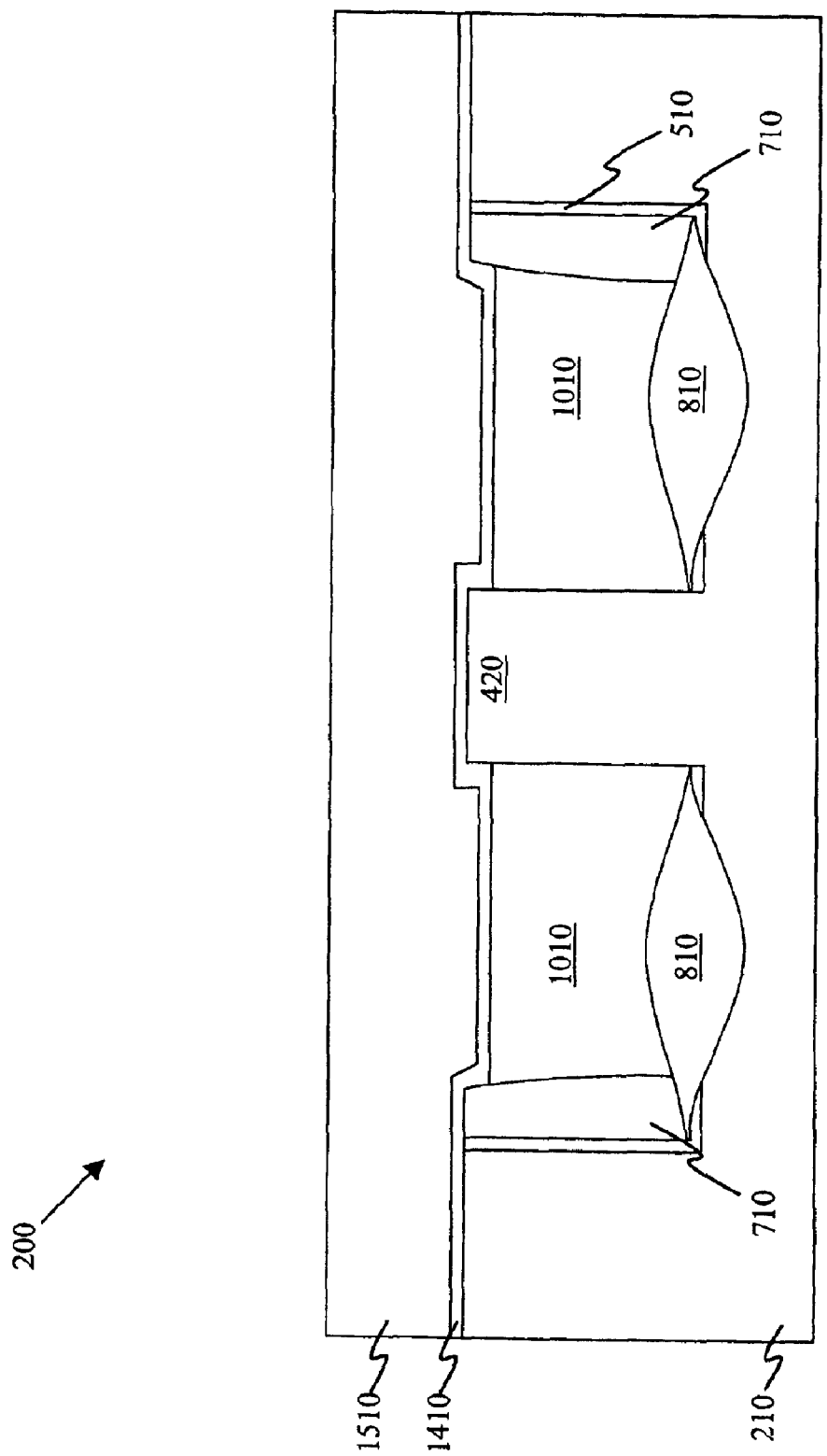
FIG. 15 illustrates the partially completed semiconductor device illustrated in FIG. 14, after formation of a gate electrode layer over the gate oxide layer.

Turning to FIG. 15, illustrated is the partially completed semiconductor device 200 illustrated in FIG. 14, after formation of a gate electrode layer 1510 over the gate oxide layer 1410. The gate electrode layer 1510, in an exemplary embodiment, comprises a layer of conductive material, such as polysilicon. One skilled in the art understands how to form the gate electrode layer 1510, including depositing polysilicon using any known or hereafter discovered deposition process.

Figure 16:
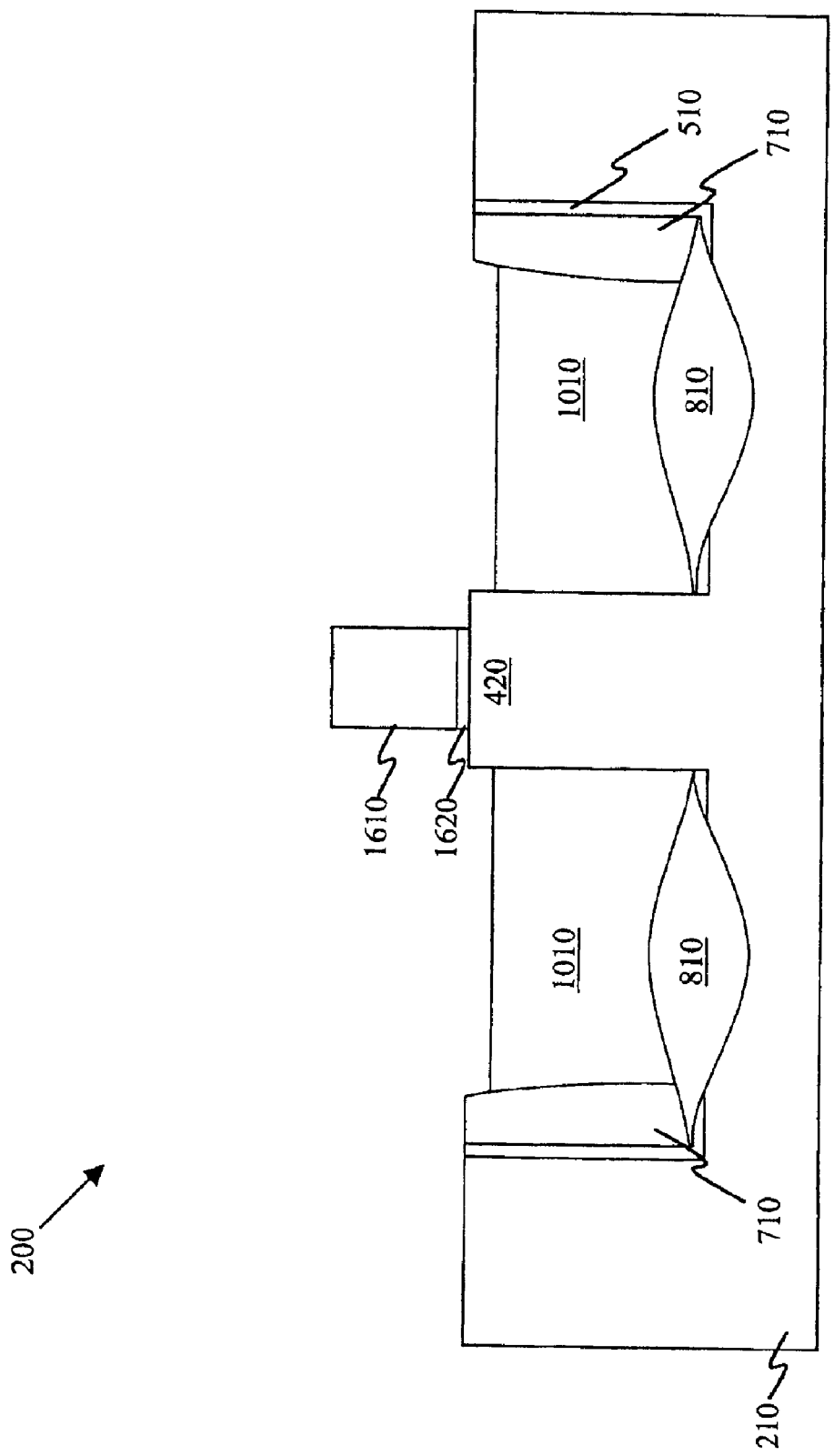
FIG. 16 illustrates the partially completed semiconductor device illustrated in FIG. 15, after defining a gate electrode and a gate oxide.

Turning to FIG. 16, illustrated is the partially completed semiconductor device 200 illustrated in FIG. 15, after defining a gate electrode 1610 and a gate oxide 1620. Generally, one having skill in the art knows how to form such a gate electrode 1610, and gate oxide 1620, including: blanket depositing the gate electrode layer 1510, doping the blanket gate electrode layer 1510, and patterning and etching the blanket gate electrode layer 1510 and gate oxide layer 1410, resulting in the gate electrode 1610 and gate oxide 1620 shown. In the illustrative embodiment shown in FIG. 16, the gate electrode 1610 and the gate oxide 1620, are located over the channel region 420 and between the first and second trenches 410, 415.

Figure 17:
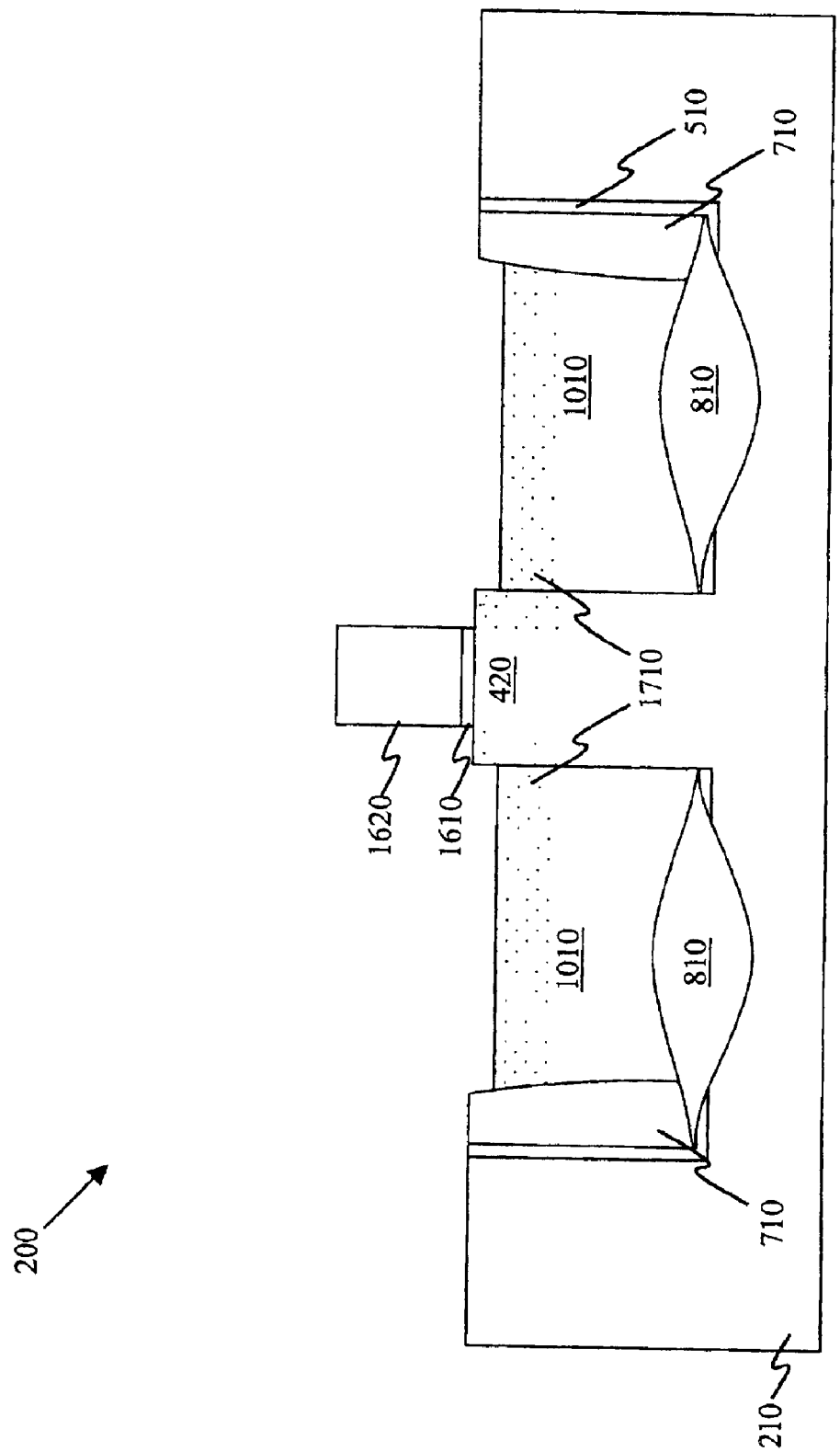
FIG. 17 illustrates the partially completed semiconductor device illustrated in FIG. 16, after forming lightly doped source/drain regions.

Turning to FIG. 17, illustrated is the partially completed semiconductor device 200 illustrated in FIG. 16, after forming lightly doped source/drain regions 1710. As illustrated, the lightly doped source/drain regions 1710, may be located in the channel region 420. As also illustrated in FIG. 17, the lightly doped source/drain regions 1710 may be initially located in the polysilicon layers 1010. Preferably, the lightly doped source/drain regions 1710 are self-aligned to the gate electrode 1610. One having skill in the art knows the standard methods used to form the lightly doped source/drain regions 1710, including forming the lightly doped source/drain regions 1710 with a dopant concentration ranging from about $1E17/cm^3$ to about $1E19/cm^3$. In one particular embodiment the dopant is a P-type dopant, thus, resulting in the partially completed semiconductor device 200 being a PMOS device. Alternatively, the dopant may be an N-type dopant, resulting in an NMOS device.

Figure 18:
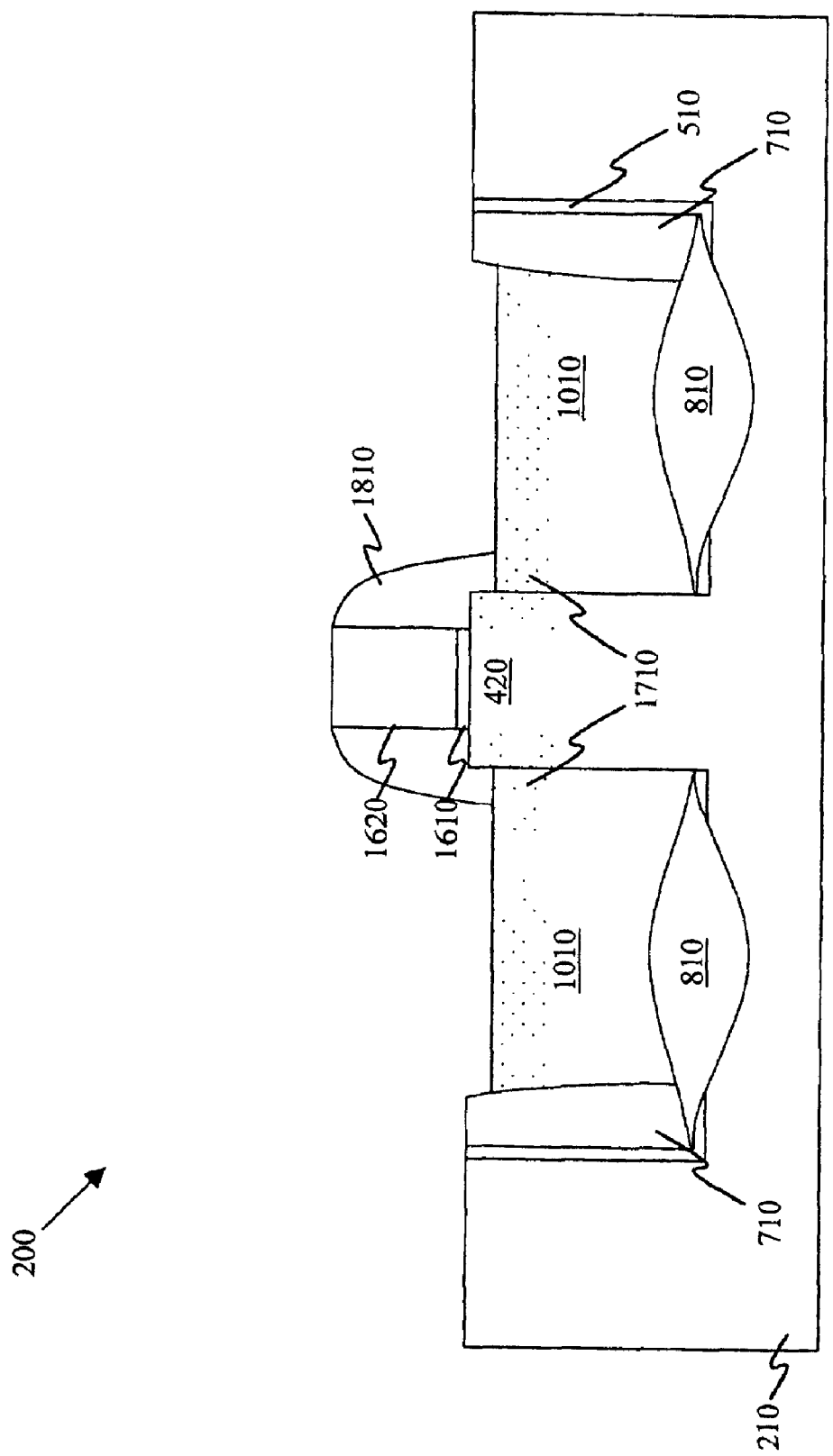
FIG. 18 illustrates the formation of gate sidewall spacers.

Turning to FIG. 18, after formation of the lightly doped source/drain regions 1710, the partially completed semiconductor device 200 may be subjected to a conformal deposition of a sidewall spacer layer. In an exemplary embodiment, the sidewall spacer layer is an oxide sidewall spacer layer. After formation of the sidewall spacer layer, the sidewall spacer layer may be etched, typically using a traditional anisotropic etch, resulting in gate sidewall spacers 1810. Gate sidewall spacers 1810 are well known in the art, therefore, they have been given only limited discussions.

Figure 19:
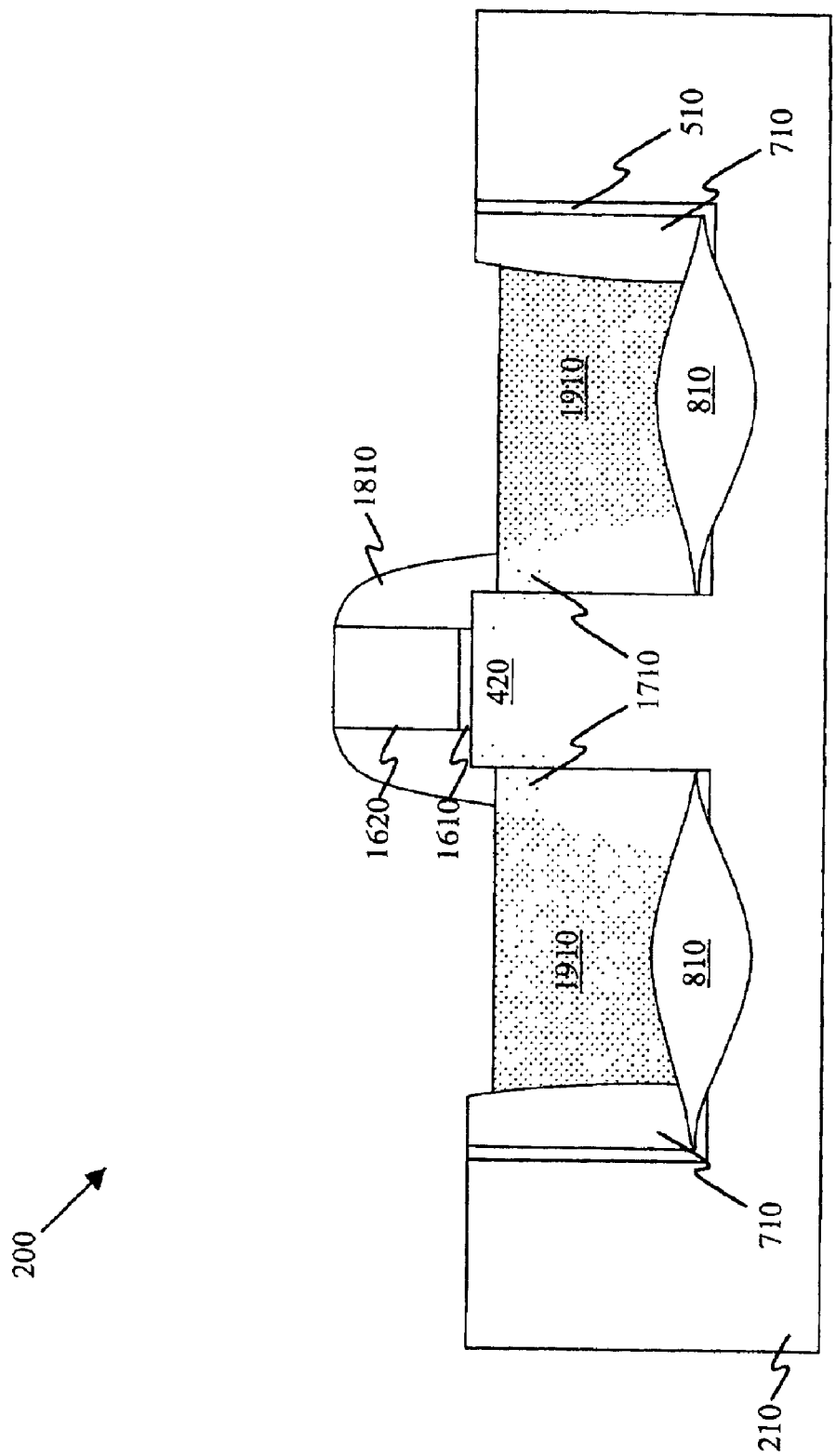
FIG. 19 illustrates the formation of source/drain contact regions.

Turning to FIG. 19, the polysilicon layers 1010 illustrated in FIG. 18 have been subjected to a contact implant, resulting in source/drain contact regions 1910. The source/drain contact regions 1910, may be desired because, theoretically, they improve the contact resistance for vertical contacts, not shown. In an exemplary embodiment, the source/drain contract region 1910 are formed by implanting the exposed polysilicon layer 1010 to a high concentration of the dopant used to form the lightly doped source/drain regions 1710. In the illustrative embodiment shown in FIG. 19, the dopant concentration used to form the source/drain contract regions 1910 is the maximum dopant concentration attainable in the polysilicon layers 1010. For example, this dopant concentration may be up to about 1E21 atoms/cm$^3$.

Since the isolation structures 810 and sidewall spacers 710 bound the source/drain contact regions 1910, a minimal amount of the dopant included within the source/drain contact regions 1910 will diffuse into the semiconductor substrate 210. Thus, any subsequent anneal steps, including anneal steps designed to push the edge of the lightly doped source/drain region 1710 junction toward the channel region 420 to assure a depletion region of the junction is within the bulk silicon rather than the polysilicon layers 1010, will not substantially drive any source/drain dopants into the semiconductor substrate 210. Following the formation of the source/drain contact regions 1910, the partially completed semiconductor device 200 may be subjected to conventional contact and metallization processes, resulting in the completed semiconductor device 100, illustrated in FIG. 1A.

Figure 20:
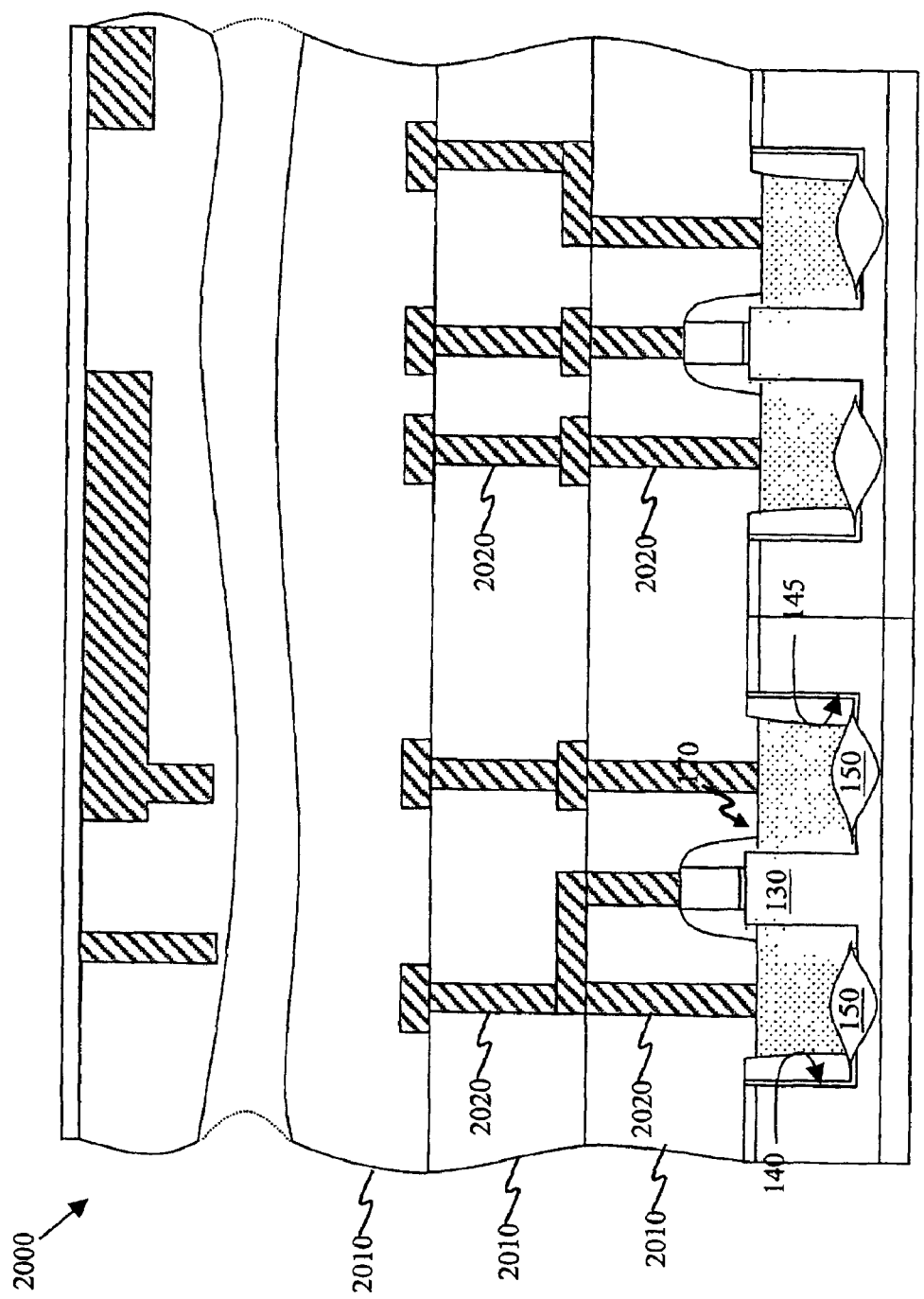
FIG. 20 illustrates a sectional view of a conventional integrated circuit (IC), which incorporates a device similar to the completed semiconductor devices illustrated in FIG. 1.

Referring to FIG. 20, illustrated is a sectional view of a conventional integrated circuit (IC) 2000, which includes a semiconductor device similar to the completed semiconductor devices 100 illustrated in FIG. 1A. The IC 2000 may also include active devices, such as Bipolar devices, BiCMOS devices, memory devices, or other types of active devices. The IC 2000 may further include passive devices, such as inductors or resistors, or it may also include optical devices or optoelectronic devices. Those skilled in the art are familiar with these various types of devices and their manufacture.

In the particular embodiment illustrated in FIG. 20, the IC 2000 includes the completed semiconductor devices 100, including the channel region 130, the first and second trenches 140, 145, the isolation structures 150, and source/drain regions 170. As illustrated, dielectric layers 2010 are located over the completed semiconductor devices 100. Additionally, interconnect structures 2020, are located within the dielectric layers 2010, contacting the completed semiconductor devices 100 to form the operational integrated circuit 2000.

Although the present invention has been described in detail, those skilled in the art should understand that they can make various changes, substitutions and alterations herein without departing from the spirit and scope of the invention in its broadest form.

What is claimed is:

1. A semiconductor device, comprising:
   a channel region located in a semiconductor substrate;
   a trench located adjacent a side of the channel region;
   an isolation structure located in the trench;
   a sidewall spacer located over at least one sidewall of the trench distal the channel region, wherein an interface exists between the sidewall spacer and the isolation structure; and
   a source/drain region located over the isolation structure.

2. The semiconductor device as recited in claim 1 wherein the trench is a first trench and the semiconductor device further includes a second trench located on an opposing side of the channel region, wherein the isolation structure is a first isolation structure located in the first trench and the semiconductor device further includes a second isolation structure located in the second trench, and wherein the source/drain region is a first source/drain region and the semiconductor device further includes a second source/drain region located over the second isolation structure.

3. The semiconductor device as recited in claim 1 wherein the source/drain region comprises polysilicon.

4. The semiconductor devices as recited in claim 1 wherein the source/drain region comprises epitaxial silicon.

5. The semiconductor device as recited in claim 1 wherein an oxide layer is located between the sidewall spacer and the at least one sidewall of the trench.

6. The semiconductor device as recited in claim 1 wherein the sidewall spacer comprises a nitrided layer.

7. The semiconductor device as recited in claim 1 wherein the isolation structure comprises an oxide.

8. The semiconductor device as recited in claim 1 wherein the source/drain region includes a lightly doped source/drain region having a dopant concentration ranging from about 1E16 atoms/cm$^3$ to about 1E17 atoms/cm$^3$, and a source/drain contact region having a dopant concentration up to about 1E22 atoms/cm$^3$.

9. The semiconductor device as recited in claim 1 wherein the sidewall spacer is not contiguous the side of the channel region.

10. A method of manufacturing a semiconductor device, comprising:
    forming a channel region in a semiconductor substrate;
    forming a trench adjacent a side of the channel region;
    forming an isolation structure in the trench;
    forming a sidewall spacer over at least one sidewall of the trench distal the channel region, wherein an interface exists between the sidewall spacer and the isolation structure; and
    forming a source/drain region over the isolation structure.

11. The method as recited in claim 10 wherein forming the trench includes forming a first trench and the method further includes forming a second trench on an opposing side of the channel region, wherein forming the isolation structure includes forming a first isolation structure in the first trench and the method further includes forming a second isolation structure in the second trench, and wherein forming the source/drain region includes forming a first source/drain region and the method further includes forming a second source/drain region over the second isolation structure.

12. The method as recited in claim 10 wherein forming the source/drain region includes forming a polysilicon source/drain region.

13. The methods as recited in claim 10 wherein forming the source/drain region includes epitaxially growing the source/drain region from the channel region.

14. The method as recited in claim 10 further including forming an oxide layer between the sidewall spacer and the at least one sidewall of the trench.

15. The method as recited in claim 10 wherein forming a sidewall spacer includes forming a nitrided layer.

16. The method as recited in claim 10 wherein forming an isolation structure includes forming an isolation structure comprising an oxide.

17. The method as recited in claim 10 wherein forming a source/drain region includes forming a lightly doped source/drain region having a dopant concentration ranging from about 1E16 atoms/cm$^3$ to about 1E17 atoms/cm$^3$, and forming a source/drain contact region having a dopant concentration up to about 1E22 atoms/cm$^3$.

18. The method as recited in claim 10 wherein the sidewall spacer is not formed contiguous the side of the channel region.

19. An integrated circuit, comprising:
    semiconductor devices, including;
    a channel region located in a semiconductor substrate;

a trench located adjacent a side of the channel region;
an isolation structure located in the trench;
a sidewall spacer located over at least one sidewall of the trench distal the channel region, wherein an interface exists between the sidewall spacer and the isolation structure; and
a source/drain region located over the isolation structure; and dielectric layers located over the semiconductor devices and having interconnect structures located therein that electrically connect the semiconductor devices to form an operative-integrated circuit.

20. The integrated circuit as recited in claim 19 wherein the trench is a first trench and the semiconductor device further includes a second trench located on an opposing side of the channel region, wherein the isolation structure is a first isolation structure located in the first trench and the semiconductor device further includes a second isolation structure located in the second trench, and wherein the source/drain region is a first source/drain region and the semiconductor device further includes a second source/drain region located over the second isolation structure.

21. The integrated circuit as recited in claim 19 wherein the isolation structure comprises an oxide.

22. The integrated circuit as recited in claim 19 wherein the semiconductor devices form part of an N-type metal oxide semiconductor (NMOS) device, a P-type metal oxide semiconductor (PMOS) device, a complementary metal oxide semiconductor (CMOS) device, a bipolar device, or a memory device.

* * * * *